United States Patent
Kasat et al.

(10) Patent No.: US 10,691,580 B1
(45) Date of Patent: Jun. 23, 2020

(54) DIAGNOSING APPLICATIONS THAT USE HARDWARE ACCELERATION THROUGH EMULATION

(71) Applicant: Xilinx, Inc., San Jose, CA (US)

(72) Inventors: Amit Kasat, Hyderabad (IN); Ch Vamshi Krishna, Hyderabad (IN); Sahil Goyal, Hyderabad (IN)

(73) Assignee: XILINX, INC., San Jose, CA (US)

( * ) Notice: Subject to any disclaimer, the term of this patent is extended or adjusted under 35 U.S.C. 154(b) by 69 days.

(21) Appl. No.: 15/825,991

(22) Filed: Nov. 29, 2017

(51) Int. Cl.
*G06F 11/36* (2006.01)
*G06F 30/331* (2020.01)
*G06F 9/455* (2018.01)

(52) U.S. Cl.
CPC .......... *G06F 11/3664* (2013.01); *G06F 9/455* (2013.01); *G06F 11/364* (2013.01); *G06F 30/331* (2020.01)

(58) Field of Classification Search
CPC ........ G06F 11/30–3696; G06F 17/5009–5031; G06F 30/33–3323; G06F 9/455
See application file for complete search history.

(56) References Cited

U.S. PATENT DOCUMENTS

| | | | | |
|---|---|---|---|---|
| 5,740,183 A * | 4/1998 | Lowe | ................... | G06F 17/5022 714/25 |
| 6,625,797 B1 | 9/2003 | Edwards et al. | | |
| 7,698,690 B2 * | 4/2010 | Krauss | ................. | G06F 11/3612 717/127 |
| 7,861,032 B2 * | 12/2010 | Song | ..................... | G06F 3/0613 711/112 |
| 8,572,359 B2 * | 10/2013 | Eichenberger | ........ | G06F 9/3887 712/241 |
| 9,218,443 B1 * | 12/2015 | Styles | ..................... | G06F 8/451 |
| 9,619,601 B1 | 4/2017 | Villarreal et al. | | |
| 10,067,710 B2 * | 9/2018 | Greathouse | ........... | G06F 3/0647 |
| 10,180,850 B1 * | 1/2019 | Kasat | ................... | G06F 9/4411 |
| 2007/0169051 A1 * | 7/2007 | Krauss | ................ | G06F 11/3612 717/154 |
| 2008/0126694 A1 * | 5/2008 | Song | ..................... | G06F 3/0613 711/112 |
| 2011/0161643 A1 * | 6/2011 | Eichenberger | ........ | G06F 9/3887 712/241 |

(Continued)

OTHER PUBLICATIONS

Anonymous, SDAccel Development Environment User Guide, Features and Development Flows, Xilinx [online], Feb. 2016 [retrieved Apr. 1, 2019], Retrieved from Internet: <URL: https://www.xilinx.com/support/documentation/sw_manuals/xilinx2015_4/ug1023-sdaccel-user-guide.pdf>, pp. 1-85.*

(Continued)

*Primary Examiner* — Todd Aguilera
(74) *Attorney, Agent, or Firm* — Kevin T. Cuenot

(57) ABSTRACT

Diagnosing applications that use hardware acceleration can include emulating, using a processor, a kernel designated for hardware acceleration by executing a device program binary implementing a register transfer level simulator for the kernel. The device program binary is executed in coordination with a host binary and a static circuitry binary. During the emulation, error conditions may be detected using diagnostic program code of the static circuitry binary. The error conditions may relate to memory access violations or kernel deadlocks. A notification of error conditions may be output.

20 Claims, 10 Drawing Sheets

(56) References Cited

U.S. PATENT DOCUMENTS

2018/0143781 A1\* 5/2018 Greathouse ........... G06F 3/0647
2018/0225169 A1\* 8/2018 Kotteri ................ G06F 11/0793
2018/0225204 A1\* 8/2018 Choudhari .......... G06F 9/45545

OTHER PUBLICATIONS

Price, J., et al., Oclgrind: An Extensible OpenCL Device Simulator, Proceedings of the 3rd Int'l Workshop on OpenCL [online], 2015 [retrieved Apr. 1, 2019], Retrieved from Internet: <URL: https://dl.acm.org/citation.cfm?id=2791333>, pp. 1-7.\*

Wang C., et al., A Validation Testsuite for OpenACC 1.0, IEEE 28th Int'l Parallel & Distributed Processing Symposium Workshop [online], 2014 [retrieved Apr. 1, 2019], Retrieved from Internet: <URL: https://ieeexplore.ieee.org/stamp/stamp.jsp?arnumber=6969543>, pp. 1407-1416.\*

Van Eijndhoven, J.T.J. et al., "A Data Flow Graph Exchange Standard," Proc. of 3rd European Conference on Design Automation, Mar. 16, 1992, pp. 193-199, IEEE, Piscataway, New Jersey, USA.

Specification and drawings for U.S. Appl. No. 14/931,071, filed Nov. 3, 2015, Kasat et al.

Specification and drawings for U.S. Appl. No. 13/944,820, filed Jul. 17, 2013, Dhume.

CA Technologies, "CA LISA® Service Virtualization," CA Technologies Data Sheet, copyright 2013, 2 pg., CA Technologies, New York, New York, USA.

\* cited by examiner

DIAGNOSING APPLICATIONS THAT USE HARDWARE ACCELERATION THROUGH EMULATION

TECHNICAL FIELD

This disclosure relates to emulating applications that use hardware acceleration.

BACKGROUND

A heterogeneous application is an application that executes on a heterogeneous computing platform. A heterogeneous computing platform refers to a data processing system that includes more than one type of processor. Typically, each different type of processor uses a different instruction set. An application written in Open Computing Language (OpenCL) is one example of a heterogeneous application. Different portions of the heterogeneous application may be designated to execute on different processors of the heterogeneous computing platform.

In some cases, one or more portions of the heterogeneous application may be designated for hardware acceleration. Hardware acceleration refers to implementing the functionality of a portion of program code in hardware or circuitry. A hardware accelerator is a circuit implementation of computer readable program instructions (e.g., program code). A hardware accelerator is functionally equivalent to the program code being hardware accelerated. Thus, rather than execute program code on a processor to perform a given task, the task may be performed by the hardware accelerator. In many cases, the hardware accelerator is able to perform tasks faster and/or using less power than a processor performing the same tasks by executing program code.

Often, a developer may wish to verify functionality and determine performance of hardware accelerated program code without having to undertake a lengthy and complex hardware implementation process involving synthesis, placement, and routing. In other cases, the developer may not have access to the hardware accelerator device being used for hardware acceleration, but still need to verify functionality and performance.

SUMMARY

In one or more embodiments, a method includes emulating, using a processor, a kernel designated for hardware acceleration by executing a device program binary that implements a register transfer level simulator for the kernel. The device program binary is executed in coordination with a host binary and a static circuitry binary. The method includes, during the emulating and using diagnostic program code of the static circuitry binary, detecting an error condition caused by the device program binary relating to a memory access violation or a kernel deadlock. A notification of the error condition is output.

In one or more embodiments, a system includes a memory configured to store program code and a processor coupled to the memory. The processor, in response to executing the program code, is configured to initiate operations including emulating a kernel designated for hardware acceleration by executing a device program binary that implements a register transfer level simulator for the kernel. The device program binary is executed in coordination with a host binary and a static circuitry binary. The operations include, during the emulating, detecting, using diagnostic program code of the static circuitry binary, an error condition caused by the device program binary relating to a memory access violation or a kernel deadlock. The operations include outputting a notification of the error condition.

In one or more embodiments, a method includes compiling, using a processor, host program code of a heterogeneous application into a host binary and generating, using the processor, a device program binary for a kernel of the heterogeneous application designated for hardware acceleration. The device program binary implements a register transfer level simulator using the kernel. The method can include compiling, using the processor, a high-level programming language model of static circuitry of a programmable integrated circuit into a static circuitry binary. The static circuitry of the programmable integrated circuit is configured to couple to a circuit implementation of the kernel. The compiling of the high-level programming language model of the static circuitry includes including, within the static circuitry binary, diagnostic program code configured to detect error conditions caused by the device program binary and relating to a memory access violation or a kernel deadlock. The static circuitry binary is used by the register transfer level simulator during emulation to detect the error conditions.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
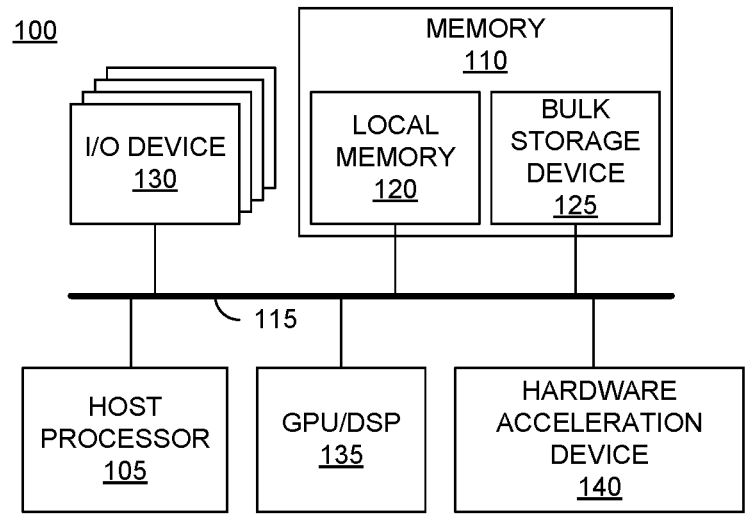
FIG. 1 illustrates an example architecture for a heterogeneous computing platform including a hardware acceleration device.

While the disclosure concludes with claims defining novel features, it is believed that the various features described within this disclosure will be better understood from a consideration of the description in conjunction with the drawings. The process(es), machine(s), manufacture(s), and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to emulating applications that use hardware acceleration. In accordance with the inventive arrangements disclosed herein, applications that use programmable integrated circuits (ICs) for hardware acceleration may be emulated. The applications may be debugged through emulation by detecting particular error conditions that occur. An application may include program code designated for execution by a processor and program code designated for hardware acceleration. An OpenCL application, for example, may include host program code that is to be executed by a host processor and one or more kernels. Program code of the OpenCL application called kernels may be executed by one or more different processors and/or designated for hardware acceleration using a programmable IC. The inventive arrangements described herein facilitate emulation and debugging of the program code of the application that is designated for hardware acceleration.

As defined herein, the term "emulate" or "emulating" means mimicking or imitating operation of an application. The term emulate may be used to refer to mimicking or imitating operation of a hardware accelerated portion of an application using a processor or processors of a data processing system through execution of emulation program code. Emulation typically refers to mimicking operation of an application, or portions thereof, using a different hardware (e.g., a different processor) than is used to actually execute the application. For example, an OpenCL application having a hardware accelerated kernel may be emulated using a computer system without any hardware acceleration device coupled thereto to implement the hardware accelerated kernel. A hardware acceleration device generally refers to hardware such as a programmable IC and/or a circuit board that implements program code (e.g., a kernel) in circuitry. The hardware acceleration device is coupled to a host processor executing host program code.

The host program code may be compiled into a host binary. The host binary may be executed in a first process of a data processing system. A model of a hardware acceleration device may be generated as a device program binary. The device program binary may be executed in a second, different process of the data processing system, i.e., the same data processing system. The device program binary may reference or use a compiled, high-level programming language (HLL) model of static circuitry within the programmable IC. The device program binary may implement a register transfer level (RTL) simulator for the program code designated for hardware acceleration. The RTL simulator is configured to call or invoke the compiled HLL models of the static circuitry.

In particular embodiments, the HLL model of the static circuitry includes diagnostic program code that is capable of detecting various types of error conditions during emulation. Examples of the types of error conditions that may be detected by the diagnostic program code include, but are not limited to, memory access violations, deadlock conditions, and loop dependencies. The diagnostic program code is capable of outputting notifications of the detected error conditions.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features. Further details for emulating an application that uses hardware acceleration are described in greater detail within this disclosure.

FIG. 1 illustrates an example architecture 100 for a heterogeneous computing platform. A heterogeneous computing platform refers to a data processing system that uses two or more different computing platforms (e.g., processors) where at least one computing platform utilizes an instruction set that is different from at least one other computing platform. Exemplary heterogeneous computing platforms may include a central processing unit (CPU) and a graphics processing unit (GPU); a CPU and digital signal processor (DSP); a CPU, a GPU, and a DSP; or other similar architecture. Other examples of heterogeneous computing platforms may include one or more of a CPU, a GPU, a DSP, or other processor that is configured to execute program code in combination with one or more hardware accelerator devices that may be used to implement program code as circuitry. One example of a hardware accelerator device is a programmable IC such as a field programmable gate array (FPGA).

As pictured, architecture 100 may include a host processor 105 (host). Host 105 may be implemented as a CPU. Host 105 may be coupled to memory 110 through a system bus 115 or other suitable circuitry. Architecture 100 stores program code within memory 110. Memory 110 may include one or more physical memory devices such as, for example, a local memory 120 and one or more bulk storage devices 125. Local memory 120 refers to random access memory (RAM) or other non-persistent memory device(s) generally used during actual execution of the program code. Bulk storage device 125 may be implemented as a hard disk drive (HDD), solid state drive (SSD), or other persistent data storage device. Architecture 100 may also include one or more cache memories (not shown) that provide temporary storage of at least some program code in order to reduce the number of times program code must be retrieved from bulk storage device 125 during execution.

Architecture 100 may be coupled to one or more input/output (I/O) devices 130. Exemplary I/O devices may include, but are not limited to, a keyboard, a display device, a pointing device, and/or one or more network adapters. For ease of illustration, an operating system and applications are not illustrated. It should be appreciated that architecture 100 may execute an operating system in combination with one or more heterogeneous applications.

In the example of FIG. 1, architecture 100 may optionally include a second platform such as one or more of a GPU and/or a DSP illustrated as GPU/DSP 135. Architecture 100, as noted, further may include a hardware acceleration device 140. Hardware acceleration device 140 may include a programmable IC that may communicate with other elements of architecture 100 through system bus 115 or other circuitry. As noted, one example of a programmable IC is an FPGA.

An application configured for hardware acceleration may be stored in memory 110 and executed by a system using architecture 100. In one arrangement, the application may be a heterogeneous application. An example of a heterogeneous application is an OpenCL application. OpenCL stands for "Open Computing Language" and is a framework for writing computer programs that may execute in heterogeneous computing platforms. When compiled, an OpenCL application may include executable program code that is executed by host 105. The OpenCL application may also include executable program code that may be referred to as a kernel. The OpenCL application may include one or more kernels that may be offloaded from host 105 to one or more of the other processors, e.g., GPU/DSP 135, for execution, thereby increasing overall execution speed and efficiency.

The OpenCL application further may include one or more kernels that may be hardware accelerated and implemented as circuitry within the programmable IC of hardware acceleration device 140. Kernels implemented as circuitry are said to be "hardware accelerated" and may be referred to as "hardware accelerators." For example, a configuration bitstream specifying a hardware accelerated version of a kernel may be stored in memory 110 as a binary file that may be loaded into the programmable IC of hardware acceleration device 140 to implement the kernel in circuitry. The circuitry of the programmable IC may implement a kernel that operates faster and with greater efficiency than had the kernel been executed as program code by GPU/DSP 135.

In developing an application that uses hardware acceleration, a developer may not have access to hardware acceleration device 140. In other cases, the developer may not have time to continually implement each variation of the program code designated for hardware acceleration in hardware for evaluation, testing, and/or debugging. Implementation of program code in hardware may be time consuming and typically requires translation of the HLL program code to be hardware accelerated to an RTL equivalent, synthesis, placement, routing, and configuration bitstream generation. Each iteration of such a design flow may take many hours for an electronic design automation (EDA) system to complete. Accordingly, emulation of the application, including those portions designated for hardware acceleration, performed entirely within a computer without the aid of a hardware acceleration device is often desirable.

For purposes of description and ease of illustration, OpenCL terminology is used throughout this application. It should be appreciated that any of a variety of different applications written in an HLL may be hardware accelerated. In this regard, within this disclosure, the term "host program code" may refer to program code that is not accelerated. For example, "host program code" may refer to program code intended to be executed by a CPU or a host processor such as host 105. The term "kernel" or "kernel program code" may refer to program code not intended to execute on the host and that may be hardware accelerated regardless of whether the program code is part of an OpenCL framework or application.

Figure 2:
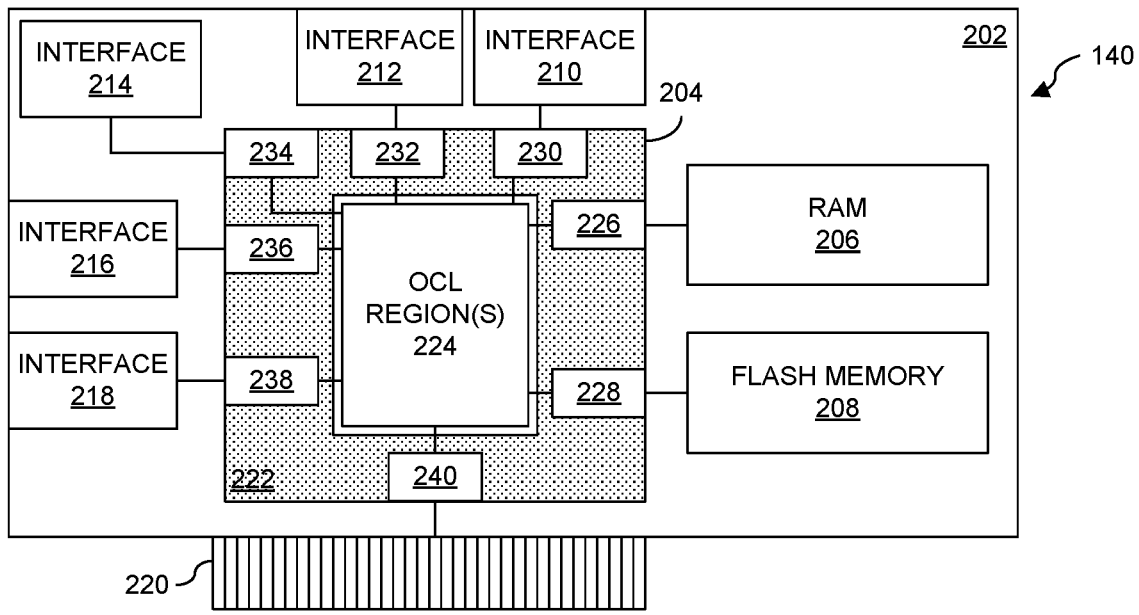
FIG. 2 illustrates an example implementation of the hardware acceleration device of FIG. 1.

FIG. 2 illustrates an example implementation of hardware acceleration device 140. Hardware acceleration device 140 may include a circuit board 202. Circuit board 202 may include a plurality of components such as a programmable IC 204, RAM 206, flash memory 208, and one or more interfaces 210, 212, 214, 216, and 218.

RAM 206 may be implemented as one or more RAM circuit modules coupled to programmable IC 204. Flash memory 208 may be implemented as one or more flash memory circuit modules coupled to programmable IC 204. Each of interfaces 210, 212, 214, 216, and 218 may be implemented as circuitry and/or a physical connector that is coupled to programmable IC 204 through circuitry on circuit board 202.

In one aspect, interfaces 216 and 218 each may be implemented as a 10 gigabit Ethernet interface that allows hardware acceleration device 140 to couple to one or more other systems. Interfaces 210 and 212 may be implemented as Serial Advanced Technology Attachment (SATA) interfaces that allow hardware acceleration device 140 to couple to one or more other systems. Interface 214 may be implemented as a Joint Test Action Group (JTAG) interface.

In the example of FIG. 2, circuit board 202 may be implemented with a form factor of a card that may plug, or be inserted, into a Peripheral Component Interconnect Express (PCIe) serial bus card slot. As such, hardware acceleration device 140 may include a card edge connector 220. Card edge connector 220 may be coupled to programmable IC 204 through circuitry on circuit board 202. Programmable IC 204 may communicate with host 105 and/or another processor (e.g., GPU/DSP 135) through communication bus 115 by way of card edge connector 220.

The examples of interfaces and connectors described above are provided for purposes of illustration and not limitation. As such, other interfaces and/or connectors may be used in lieu of and/or in combination with those described herein.

In one arrangement, programmable IC 204 may be implemented as an FPGA. As pictured, programmable IC 204 may include static circuitry 222 and one or more Open CL (OCL) regions 224. Static circuitry 222 is indicated with shading. The various circuit blocks within the shaded portion of programmable IC 204 are part of static circuitry 222. For example, static circuitry 222 may include a RAM (e.g., memory) interface circuit 226 (e.g., a RAM memory controller), a flash interface circuit 228 (e.g., a flash memory controller), and interface circuits 230, 232, 234, 238, and 240. OCL regions 224 are not part of, or included within, static circuitry 222. For purposes of illustration, interface circuits 230 and 232 may be SATA interface circuits. Interface circuits 236 and 238 may be 10 gigabit Ethernet interface circuits. Interface circuit 240 may be a PCIe interface circuit. Interface circuit 234 may be a JTAG circuit or port.

In one arrangement, static circuitry 222 may be implemented by loading a static circuit design, e.g., a configuration bitstream, into configuration memory of programmable IC 204. In one aspect, the configuration bitstream specifying static circuitry 222 may be a full configuration bitstream. In another aspect, the configuration bitstream specifying static circuitry 222 may be a partial configuration bitstream. Static circuitry 222, and as such, the static circuit design specifying static circuitry 222, may be implemented as a static region in terms of performing dynamic partial reconfiguration.

OCL region(s) 224 represent the area of programmable IC 204 in which hardware accelerators, e.g., hardware accelerated kernels, may be implemented as circuitry. OCL region(s) 224, for example, may be implemented as dynamically reconfigurable regions. In general, dynamic partial reconfiguration is the ability to dynamically modify blocks of programmable circuitry of a programmable IC such as OCL region 224 by downloading partial configuration bitstreams (e.g., partial bit files) while the remaining circuitry such as static circuitry 222 continues to operate without interruption. As such, one or more partial configuration bitstreams may be loaded into programmable IC 204 to implement static circuitry 222 and/or one or more hardware accelerators (e.g., kernels designated for hardware acceleration) in OCL region(s) 224.

In one arrangement, static circuitry 222 provides interface circuitry for hardware accelerated kernels implemented in OCL regions 224. Static circuitry 222 may be considered unchanging. The circuitry implemented in OCL regions 224 is not static. More particularly, circuitry in OCL regions 224 is derived from user designs, i.e., program code of a user application that is to be hardware accelerated, and, as such, changes from one application to another. Static circuitry 222 may remain unchanged regardless of the kernels that are hardware accelerated in OCL regions 224. It should be appreciated, however, that both static circuitry 222 and OCL regions 224 may be implemented using programmable circuitry of programmable IC 204. Static circuitry 222 does not change with different user kernel designs as does OCL regions 224.

FIGS. 1 and 2 are presented herein to illustrate various aspects of a heterogeneous computing platform that may be emulated. In one or more other embodiments, a heterogeneous computing platform may be implemented as a system-on-chip type of device that includes programmable circuitry having an OCL region and static circuitry as described and also an embedded processor coupled to the programmable circuitry that operates as the host.

In one arrangement, the entirety of programmable IC 204 and/or hardware accelerator device 140 may be emulated as a device program binary and/or a static circuitry binary to be described herein in greater detail. The device program binary may emulate operation of circuitry implemented within OCL regions 224, while static circuitry binary 350 is capable of emulating operation of static circuitry of programmable IC 204 and/or circuit board 202. Functionality of the host may be emulated through execution of a host binary.

Figure 3:
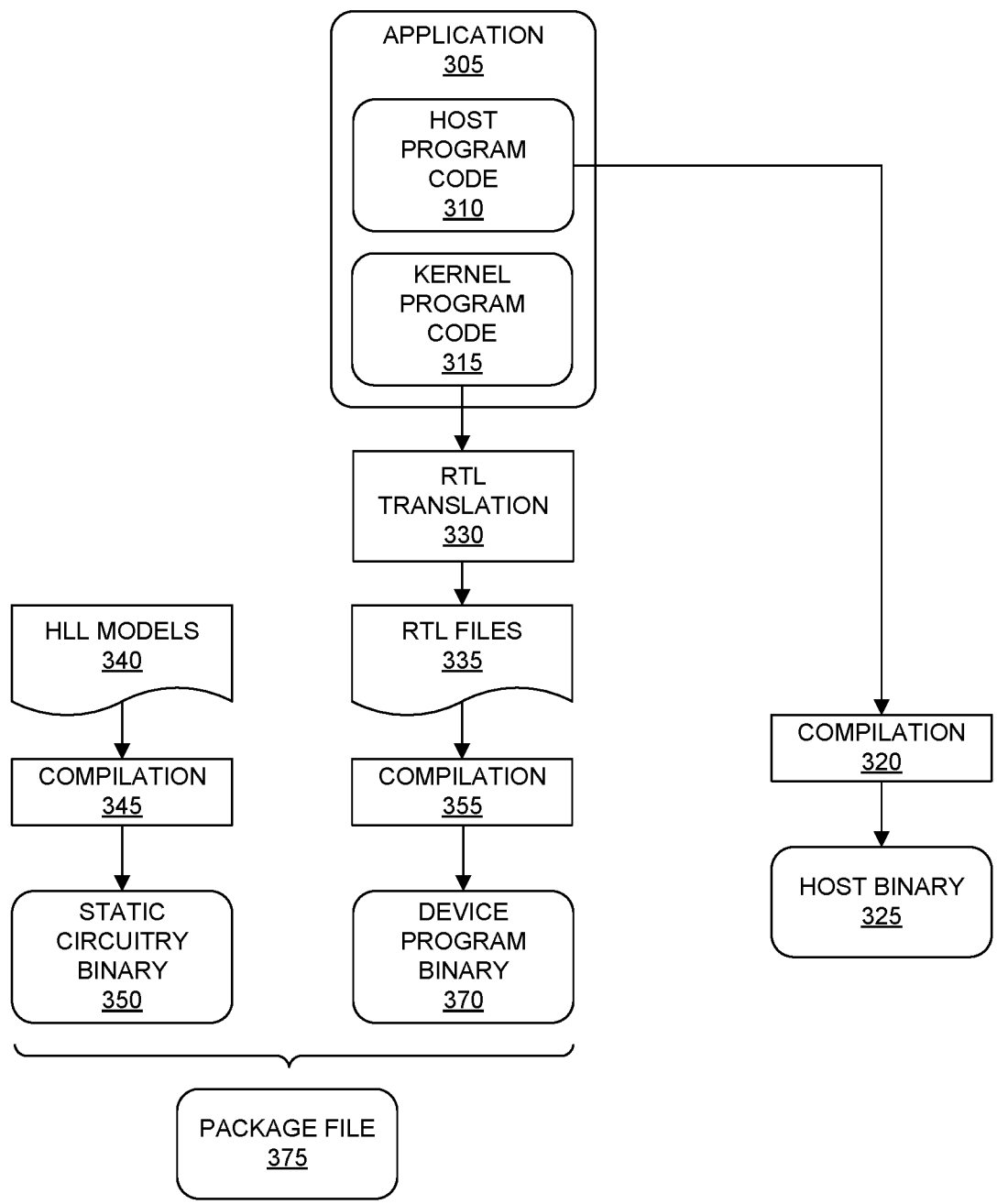
FIG. 3 illustrates an example of compile time operations for emulating an application that uses hardware acceleration.

FIG. 3 illustrates an example of compile time operations for emulating an application that uses hardware acceleration. FIG. 3 illustrates compile time operations that generate the executable program code used to emulate execution of an application that uses hardware acceleration. The various operations described in connection with FIG. 3 may be performed by a data processing system. The data processing system (system) used to perform the operations illustrated in FIG. 3 may or may not be the same system used to subsequently emulate execution of the application.

Application 305 may include different portions of program code. In one example, application 305 is an OpenCL application. In another example, application 305 may be written in an HLL or in two or more different HLLs. As pictured, application 305 may include host program code 310 and kernel program code 315. Host program code 310 and kernel program code 315 may be specified as source code. Kernel program code 315 may include one or more kernels that are designated for hardware acceleration. Kernel program code 315 may be specified in the same HLL as host program code 310 or in a different HLL.

Host program code 310 may undergo compilation 320 as performed by a system executing a compiler. In one aspect, host program code 310 may be compiled without any modification to the compilation process for purposes of emulation. For example, host program code 310 may be compiled as is normally the case for execution on a host. Accordingly, compilation 320 may generate a host binary 325. In one or more embodiments, host binary 325 is an executable version of host program code 310. For example, host binary 325 may be implemented as object code.

Kernel program code 315 may optionally undergo RTL translation 330 to generate one or more RTL files 335. In this example, kernel program code 315 is designated for hardware acceleration. For example, initially, kernel program code 315 may be specified in an HLL. RTL translation 330 may be performed by the system executing suitable software, e.g., an EDA system or other hardware compilation software. The system that performs RTL translation 330 may be the same as or different from the system used to perform compilation 320. As noted, RTL translation 330 presumes that kernel program code 315 is originally specified in an HLL. In other arrangements, kernel program code 315 may be specified initially in RTL. In that case, RTL translation 330 need not be performed.

HLL models 340 may undergo compilation 345. HLL models 340 are HLL models of the static circuitry of the programmable IC described with reference to FIG. 2. As noted, the static circuitry may remain constant despite the ability to accommodate changing hardware accelerators. Accordingly, HLL models 340 may be created for the static circuitry. HLL models 340 may undergo compilation 345 as performed by the system executing a compiler. The system responsible for compilation 345 may be the same as or different from the system performing compilation 320, RTL translation 330, and/or compilation 355. Compilation 345 generates a static circuitry binary 350. Static circuitry binary 350 may be implemented as executable program code. For example, static circuitry binary 350 may be implemented as object code.

RTL files 335 may undergo compilation 355. In one arrangement, compilation 355 may generate a device program binary 370. Device program binary 370 may be executable program code. In one aspect, device program binary 370 may be implemented as an RTL simulator for kernel program code 315 and/or RTL files 335. The RTL simulator is executable program code, e.g., object code. Since device program binary 370 is a binary file, device program 370 may be handled by a host. The system responsible for compilation 355 may be the same as or different from the system used for compilation 320.

In one or more embodiments, the RTL simulator implemented as device program binary 370 may be linked with static circuitry binary 350. Static circuitry binary 350 may be implemented as one or more shared objects. For example, static circuitry binary 350 may be implemented as one or more dynamic link libraries. Dynamic link libraries may have extensions such as *.so or *.dll, for example. Accordingly, device program binary 370, e.g., the RTL simulator, when executed for performing emulation, may call or invoke one or more functions of static circuitry binary 350. In particular embodiments, static circuitry binary 350 executes in a same process as device program binary 370. Host binary 325 and device program binary 370 may execute in different processes of the system used to perform emulation.

The inventive arrangements described herein allow emulation to be performed with increased speed over other conventional emulation techniques. RTL emulation of real hardware is often slow and unusable for software development purposes. By using a hybrid emulation infrastructure that uses static circuitry binary 350 for emulating operation of the static circuitry and device program binary 370 for emulating the dynamic (e.g., kernel specific) portion of the application, faster and more efficient emulation may be performed.

In one or more embodiments, static circuitry binary 350 and device program binary 370 may be combined into package file 375. For example, package file 375 may be a zip or other compressed file format or container that allows two or more files to be combined.

Figure 4:
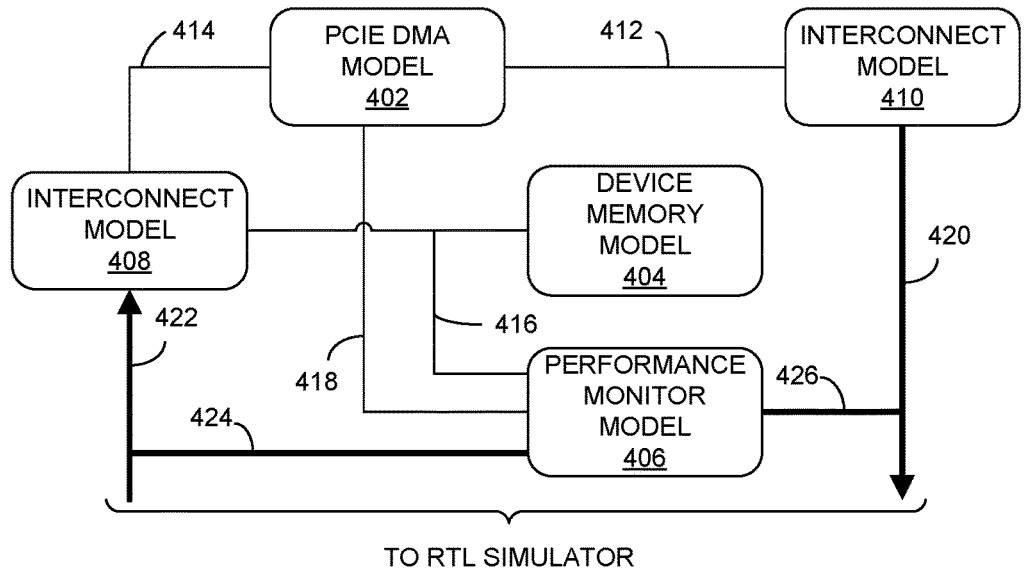
FIG. 4 illustrates an example architecture defined by high-level programming language (HLL) models for static circuitry of a programmable integrated circuit (IC).

FIG. 4 is a block diagram illustrating an example architecture defined by HLL models for the static circuitry. FIG. 4 illustrates an example architecture that HLL models 340 may specify. As pictured, the architecture may include a PCIe direct memory access (DMA) model 402, a device memory model 404, and a performance monitor model 406. Interconnect models 410 may also be included. In the example of FIG. 4, thin lines such as lines 412, 414, 416, and 418 represent the exchange of data during emulation using HLL transactions. Bold lines such as lines 420, 422, 424, and 426 represent the exchange of data as RTL signals. RTL signals are pin level signals as specified in an RTL description of circuitry.

As defined herein, an "HLL transaction" is the passing of data (e.g., signals), formatted as arguments and/or data types including data structures that may be passed from one function to another and/or used within HLL program code. For example, an HLL transaction may be a C and/or C++ transaction where arguments having a defined C and/or C++ data types that may be passed from one function to another.

In one arrangement, PCIe DMA model 402 may be configured to emulate operation of interface 240 of programmable IC 204. In another arrangement, PCIe DMA model 402 may be configured to emulate operation of interface 240, connector 220, and/or any circuitry of circuit board 202 coupling interface 240 and connector 220. In one or more embodiments, PCIe DMA model 402 includes diagnostic program code that is capable of tracking and monitoring various memory operations (e.g., memory accesses such as read operations and/or write operations) initiated by the kernel (e.g., execution of device program binary 370) during emulation. The memory operations are directed to device memory model 404.

Device memory model 404, for example, may emulate operation of interface circuit 226 (e.g., a DDR memory controller) and RAM 206. In one or more embodiments, device memory model 404 includes diagnostic program code that is capable of tracking and monitoring various memory operations (e.g., memory accesses such as read operations and/or write operations) initiated by the kernel (e.g., execution of device program binary 370) during emulation on device memory model 404.

Interconnect models 408 and 410 may emulate operation of interconnect circuitry. For example, interconnect models 408 and/or 410 may emulate operation of AXI interconnect circuitry on programmable IC 204. In one or more embodiments, interconnect models 408 and/or 410 include diagnostic program code that is capable of tracking and monitoring various memory operations (e.g., memory accesses such as read operations and/or write operations) initiated by the kernel (e.g., execution of device program binary 370) during emulation on device memory model 404.

Performance monitor model 406 may be configured to emulate operation of an interconnect performance monitor. For example, performance monitor model 406 may emulate operation of an AXI performance monitor (APM) circuit block. Performance monitor model 406 may include diagnostic program code for tracking and/or measuring various events during emulation. For example, performance monitor model 406 may be configured to measure or count the number of transactions that occur during emulation, latencies, bandwidth, etc. on the monitored interfaces. In another example, performance monitor model 406 may be configured to monitor communications between two or more models of circuit blocks (e.g., two IPs or cores) and/or communications with a memory model such as device memory model 404. Performance monitor model 406 is capable of monitoring the RTL signals of the RTL simulator, e.g., as represented by lines 424 and 426. Performance monitor model 406 may determine how many read and/or write operations have occurred, how long the operations take, when the operations started and/or stopped, etc.

During emulation, performance monitor model 406, interconnect model(s) 408, 410, PCIe DMA model 402, and/or device memory model 404 are capable of storing information about various statistics within an internal data structure. In one arrangement, an emulation driver (used by the host binary to communicate with the device program binary) may use a callback function to read performance statistics from the device program binary using inter-process communication (IPC) established at runtime of the device program binary. During emulation, the host binary and/or emulation driver may use IPC to directly access the gathered profiling information from the various models of the static circuitry binary via function calls as opposed to executing interconnect, e.g., AXI, transactions, to read back data. As such, emulation is largely non-intrusive in relation to communicating performance statistics between the host binary and the device program binary.

In one or more other embodiments, an OpenCL runtime executing in a same process as the host binary may be programmed to call or poll profiling and/or trace application programming interfaces (APIs) of the emulation driver at regular intervals to access PCIe DMA model 402, device memory model 404, performance monitor model 406, interconnect model 408, and/or interconnect model 410.

PCIe DMA model 402 may communicate with interconnect model 410 as illustrated by line 412, interconnect model 408 as illustrated by line 414, and performance monitor 406 as illustrated by line 418. Line 412, for example, may represent HLL transactions emulating operation of an OCL_CTRL port carrying communications from PCIe DMA model 402 to interconnect model 410. Line 414 may represent HLL transactions emulating transactions between interconnect model 408 and PCIe DMA model 402. Line 418 may represent HLL transactions emulating operation of transaction level monitoring performed by performance monitor model 406.

Interconnect model 410 may be configured to translate HLL transactions received from PCIe DMA model 402 into RTL signals represented by line 420. RTL signals represented by line 420 may be provided to the RTL simulator representing the OCL region of the programmable IC during emulation. Interconnect model 408 may be configured to receive RTL signals represented by line 422 from the RTL simulator and translate the RTL signals to HLL transactions that may be output to device memory model 404 as represented by line 416 and/or to PCIe DMA model 402 by line 414.

For purposes of illustration, consider the case of an x86 based host and PCIe interface to the programmable IC. The static circuitry of the programmable IC may be emulated using HLL models as described with reference to FIG. 4. Using HLL models for the static circuitry facilitates faster, more responsive emulation. The resulting static circuitry models may interface with the RTL simulator (e.g., device program binary) using any of a variety of APIs such as, for example, SystemVerilog Direct Programming Interface (DPI), SystemC, or another suitable API.

In another arrangement, HLL models as illustrated in FIG. 4 may be configured, prior to and/or during runtime, to operate at different levels of granularity. For example, static circuitry binary 350 as illustrated in FIG. 4 may implement untimed emulation of static circuitry, cycle approximate emulation of static circuitry, or emulation at varying levels between untimed and cycle approximate emulation.

In another aspect, one or more additional models may be included for the static circuitry. Modeling of the static circuitry may be extended to support the OpenCL IO Pipes type of memory object which allows additional data to be provided to the hardware accelerated kernel. For example, one or more I/O models of circuit blocks such as video receiver circuits, video output circuits, Ethernet interface circuits, and the like may be added to the static circuitry models. When emulation starts, the I/O models may read and/or write to a file thereby mimicking, or emulating, data acquisition, sending, and/or streaming of data with external sources. The I/O models may inject the acquired data into the device program binary. For example, the acquired data may be provided to the RTL simulator (kernel), to the device memory model, etc.

Figure 5:
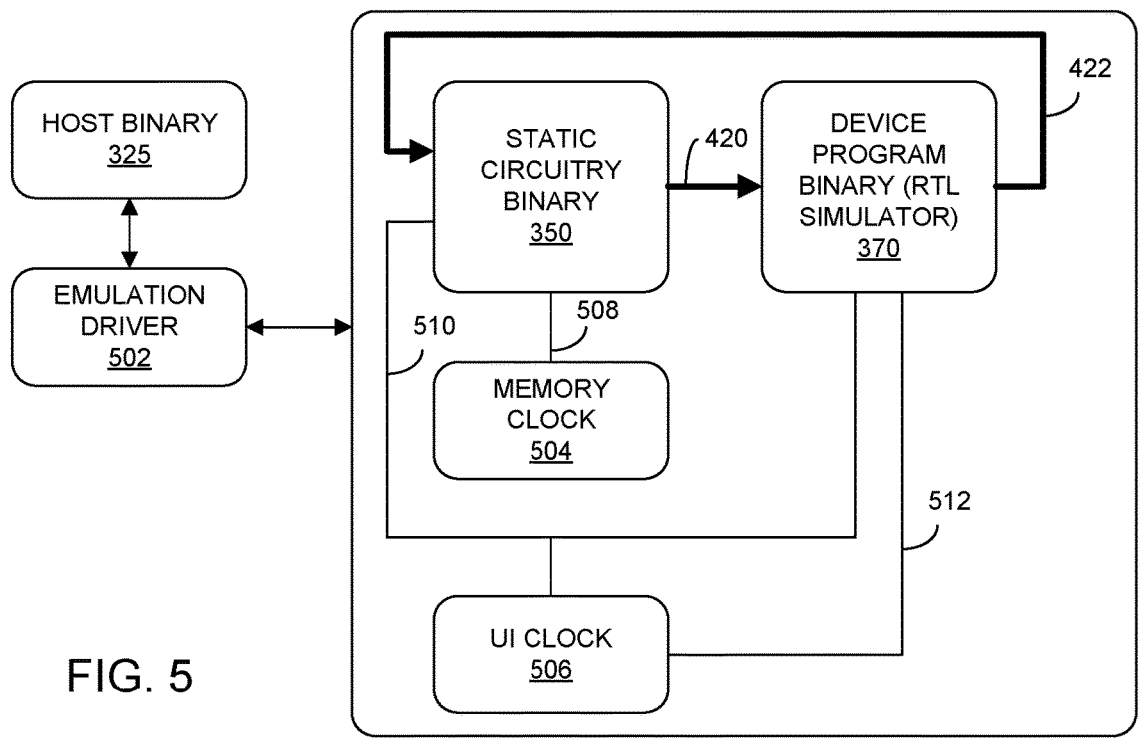
FIG. 5 illustrates an example software architecture for emulating execution of an application that uses hardware acceleration.

FIG. 5 illustrates an example software architecture for emulating execution of an application that uses hardware acceleration. FIG. 5 illustrates a runtime example of emulating an application that uses hardware acceleration. In general, host binary 325, static circuitry binary 350, and device program binary 370 operate in cooperation with one another. As pictured, host binary 325 may execute. Host binary 325 may include, or utilize, an OpenCL runtime (e.g., runtime library). The OpenCL runtime may load emulation driver 502. Emulation driver 502 may initiate execution of device program binary 370 and/or static circuitry binary 350. For example, as noted, device program binary 370 may be an RTL simulator. RTL simulator, upon execution, may load various functions of static circuitry binary 350. For purposes of discussion, static circuitry binary 350 may implement the architecture described with reference to FIG. 4.

In one or more embodiments, emulation driver 502 executes device program binary 370 in a different process than the process in which host binary 325 executes. For example, emulation driver 502 may fork the process of host binary 325. Thus, device program binary 370 may be implemented as a self-contained simulation model that executes in its own process independent of host binary 325. Device program binary 370 may invoke static circuitry binary 350 and the two may execute in a same process. Host binary 325 may communicate with device program binary 370 using IPC as may be implemented by emulation driver 502. IPC may be implemented using file based sockets, TCPIP sockets, or the like. In one aspect, emulation driver 502 may communicate with device program binary 370 using Hypertext Application Language (HAL) APIs.

Since host binary 325 and device program binary 370 execute in different processes, the host program code may be compiled using a different compiler than is used for the HLL models of the static circuitry. Thus, host binary 325 may be generated at one time and by one party, while device program binary 370 may be generated at a different or later time and/or by a different party. Use of different processes for execution during emulation further minimizes the memory requirements for execution of host binary 325 and aids in debugging. Process separation further protects host binary 325 from corruption from any issues relating to implementation of device program binary 370.

As pictured, static circuitry binary 350 may receive clock signals during emulation from a memory clock block 504 as represented by line 508. In one aspect, memory clock block 504 is implemented as program code configured to provide clock signals to static circuitry models 350. A user interface (UI) clock block 506 (e.g., program code that provides clock signals) may provide clock signals represented by line 510 to static circuitry binary 350 and to device program binary 370. UI clock 506 further may provide a reset signal to device program binary 370 as represented by line 512. Memory clock 504 and UI clock 506 may be implemented independently of one another and independently of static circuitry binary 350 and device program binary 370. In another aspect, memory clock 504 and/or UI clock 506 may be incorporated into static circuitry binary 350 and/or device program binary 370.

Figure 6:
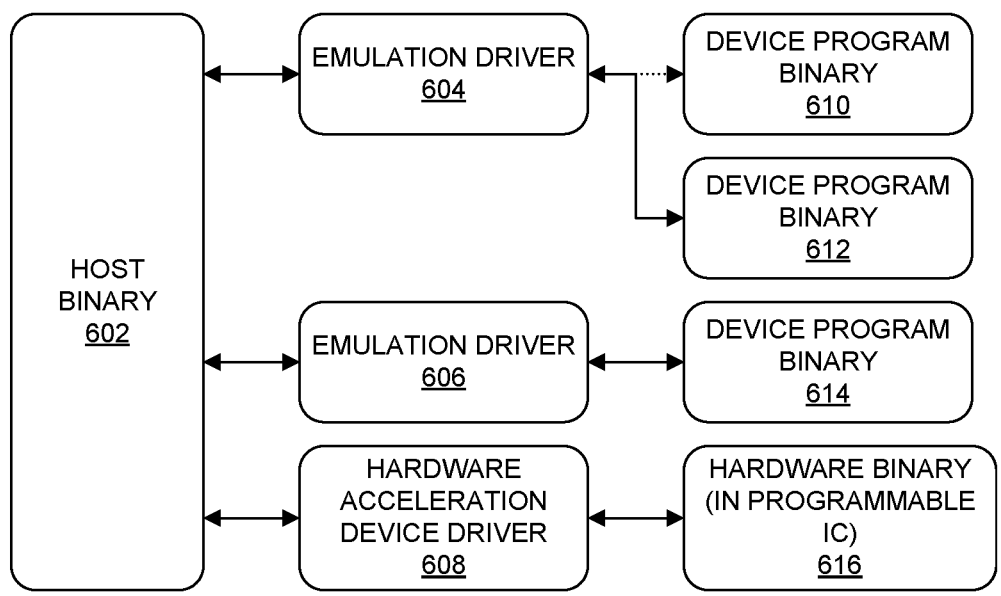
FIG. 6 illustrates another example software architecture for emulating execution of an application that uses hardware acceleration.

FIG. 6 illustrates another example software architecture for emulating execution of an application that uses hardware acceleration. FIG. 6 illustrates an example where a host binary 602 may interact with one or more different binaries for emulation and/or for performing actual hardware acceleration. The example of FIG. 6 illustrates that host binary 602 may interact with more than one device program binary concurrently. Further, host binary 602 may interact with one or more device program binaries concurrently with a hardware binary 616.

Each of device program binaries 610, 612, and 614 represents an executable model of a programmable IC or a hardware acceleration device having a programmable IC. Emulation driver 604 may communicate with device program binary 610 and device program binary 612 but not concurrently. Emulation driver 606 may communicate with device program binary 614. Hardware acceleration device driver 608 may communicate with hardware binary 616.

The combination of emulation driver 604, device program binary 610, and device program binary 612 illustrates one technique for emulating a hardware acceleration device where the programmable IC undergoes dynamic reconfiguration and/or partial dynamic reconfiguration. For example, the solid arrow coupling emulation driver 604 with device program binary 612 indicates that device program binary 612 is currently loaded and executing to communicate with host binary 602. The dotted line to device program binary 610 indicates that device program binary 610 is not loaded or executed while device program binary 612 is loaded and executed. Device program binary 612 represents an executable emulation of a particular configuration of the programmable IC. Device program binary 612 may represent an implementation in which the programmable IC has one or more kernels implemented within the OCL region. Device program binary 610 may represent a different implementation in which the programmable IC has one or more different kernels implemented within the OCL region.

Host binary 602 may communicate with device program binary 612 through emulation driver 604. When finished using device program binary 612, host binary 602 may instruct emulation driver to use and/or load different kernels that may be emulated by device program binary 614. In a traditional hardware acceleration, the requested operations would cause a hardware acceleration driver to initiate reconfiguration of the programmable IC to implement the necessary kernels in circuitry. In the case of FIG. 6, the instructions from host binary cause emulation driver 604 to shut down the RTL simulator of device program binary 612. Other entities such as host binary 602, emulation driver 604, emulation driver 606, hardware acceleration device driver 608, device program binary 614, and hardware binary 616 may continue to operate. Emulation driver 604 may load device program binary 610. Host binary 602 may continue execution and, once loaded, access device program binary 610 through emulation driver 604.

The unloading of device program binary 612 and subsequent loading of device program binary 610 may be conducted concurrently with continued access and operation of host binary 602, device program binary 614, and hardware binary 616. In one arrangement, emulation driver 604 may handle the loading and unloading operations responsive to instructions from host binary 602. Since host binary 602 is compiled in a standard way as if being compiled for actual execution on a heterogeneous system as opposed to emulation, the instructions from host binary 602 are standard instructions for accessing a particular kernel. For example, if the instructions from host binary 602 were executed by hardware acceleration device driver 608, hardware acceleration device driver 608 would initiate reconfiguration of the programmable IC coupled thereto. In the case of using an emulation driver, emulation driver 604 interprets the instructions from host binary 602 to unload one device program binary and load a different device program binary. Host binary 602 continues to operate as is normal and unaware of which hardware acceleration devices are emulated and which are not.

While device program binary 610 and device program binary 612 may emulate different kernel implementations, it should be appreciated that device program binary 610 and device program binary 612 may utilize same static circuitry models. In another arrangement, however, device program binary 610 and device program binary 612 may utilize different static circuitry models.

Device program binaries such as device program binary 610 and device program binary 612 that communicate using a same type of communication channel may communicate with host binary 602 using a same emulation driver, albeit in a serial manner one device program binary at a time. Since device program binary 610 and device program binary 612 represent different configurations of a same hardware acceleration device and/or programmable IC, each may emulate the same communication channel, e.g., PCIe, to communicate with host binary 602 and, therefore use the same emulation driver.

Device program binary 614 may represent an emulation of a different hardware acceleration device than is represented by either device program binary 610 or device program binary 612. In one aspect, device program binary 614 may communicate with host binary 602 using the same communication channel as is used by device program binary 610 and/or device program binary 612. In another aspect, device program binary 614 may communicate with host binary 602 through a different communication channel, e.g., a Universal Serial Bus (USB). In either case, to support concurrent operation of device program binary 614 with hardware binary 616 and one of device program binaries 610 or 612, device program binary 614 uses a different emulation driver, i.e., emulation driver 606.

As discussed, since host binary 602 is compiled in the same manner as when performing compilation for an actual, functioning system, host binary 602 further may communicate with a physical hardware acceleration device illustrated in FIG. 6 by hardware binary 616. Hardware binary 616 is a binary file that may include one or more configuration bitstreams that may be loaded into an actual programmable IC. As discussed, host binary 602 may communicate with the device program binaries 614, hardware binary 616, and one of device program binary 610 or device program binary 612 concurrently while emulating execution of the application. Each device program binary represents the emulation of an entire, different hardware acceleration device.

It should be appreciated that emulation may be performed using two or more device program binaries to emulate reconfiguration and/or partial reconfiguration of the programmable IC using the same emulation driver where the device program binaries are used serially. Emulation may be performed where two or more device program binaries are used concurrently representing different hardware acceleration devices where each device program binary uses a different emulation driver. Further, emulation may be performed using a combination of program device binaries in combination and concurrently with a hardware acceleration device. In this regard, the example of FIG. 6 is not intended as a limitation.

With reference to FIG. 6, in one arrangement, each device program binary 614 and device program binary 612 may execute in different processes that are both different from the process in which host binary 602 executes. In another aspect, however, device program binary 612 and device program binary 614 may execute in a same process, but one that is still different from the process in which host binary 602 executes. Device binary 610 and device program binary 612 may execute in a same process since the two binaries are not executed concurrently. Varying degrees of isolation may be achieved between host binary 602 and device program binaries and between individual device program binaries that may operate concurrently depending upon the particular number of processes used.

Figure 7:
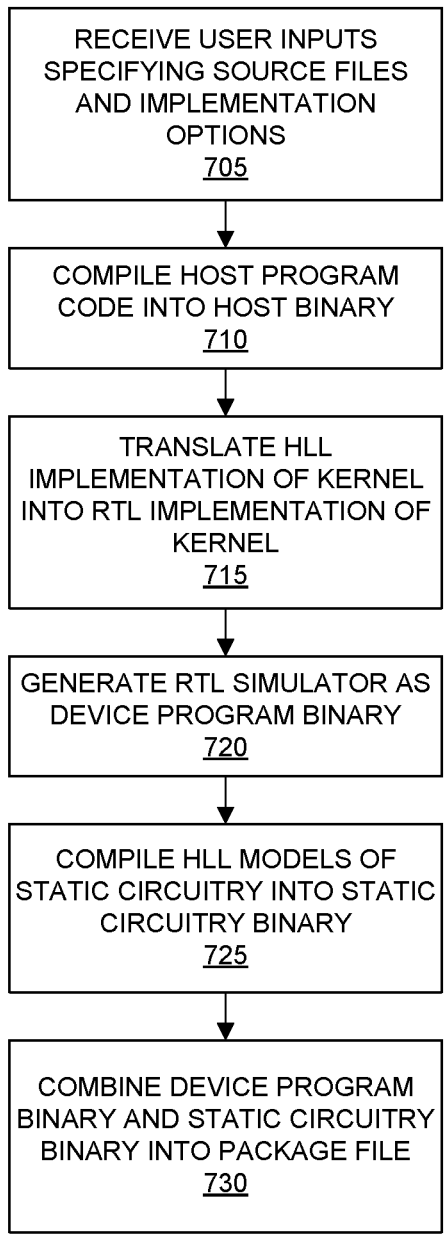
FIG. 7 illustrates an example method for emulating an application that uses hardware acceleration.

FIG. 7 is a flow chart illustrating an example method 700 of emulating an application that uses hardware acceleration. Method 700 illustrates operations that may be performed by a data processing system (system) in preparing to emulate an application that uses hardware acceleration. For example, method 700 illustrates "compile time" operations.

In block 705, the system may receive one or more user specified inputs. For example, the system may receive a user input specifying host program code of the application and one or more kernels designated for hardware acceleration. The user specified inputs further may indicate one or more implementation options. For example, the user inputs may indicate that the application and/or particular kernels of the application are to be emulated.

Further, the user inputs may select a particular hardware acceleration device, or devices as the case may be, that is to be emulated for one or more kernels. As discussed, the selection of a particular hardware acceleration device may indicate to the system a particular circuit board and a particular programmable IC on the circuit board. The device program binary using the HLL models may be configured to emulate any of a variety of different types of hardware acceleration devices. The attributes of physical hardware such as clock frequencies, latencies and/or delays, etc. may be used to configure and modify the behavior of the device program binary through modification of the HLL models using settings of the selected hardware acceleration device for emulation and/or to select different HLL models corresponding to the specified acceleration device(s) and/or programmable ICs.

In block 710, the system may compile the host program code into a host binary. The host binary may be a standalone executable file. In block 715, the system may optionally translate an HLL implementation of the kernel into an RTL implementation of the kernel. Appreciably, block 715 need only be performed in cases where the kernels are specified using an HLL. In the case where the kernel(s) are specified using RTL, block 715 is not required. In one arrangement, whether block 715 is performed may be specified as one of the user specified inputs received by the system in block 705.

In one aspect, block 715 may generate a hardware module that may be instantiated within the programmable IC. For example, the hardware module that is generated in RTL may be specified in a hardware description language such as VHDL, Verilog, or another suitable hardware description language. The hardware module, for example, if processed through a design flow involving synthesis, placement, and routing, may be instantiated (i.e., implemented) within the OCL region of the programmable IC.

In block 720, the system may generate an RTL simulator as the device program binary. As noted, the RTL simulator may be a binary file. In one arrangement, the system may compile the RTL implementation of the kernel using a particular hardware description language (HDL) simulation and/or development environment to generate an executable, i.e., the RTL simulator. The particular HDL tool used may be specified as one of the user specified inputs received in block 705. In one example, the HDL simulation environment may be an interpreted-code simulator that uses the RTL description(s) as data that may be included in and used by the RTL simulator. It should be appreciated that the resulting RTL simulator, when executed, performs RTL emulation of the kernel. Execution of the RTL simulator emulates operation of the hardware accelerated kernel(s). The particular HDL tool that is specified may include standard mechanisms for calling compiled HLL program code such as the compiled HLL models of the static circuitry of the programmable IC.

In one or more embodiments, the system is capable of generating metadata that describes the device program binary. The metadata, for example, may be implemented as an eXtensible Markup Language (XML) file. The XML file is capable of specifying the addresses of registers (e.g., memory) for interacting with the kernel specified by the device program binary. The emulation driver is capable of using the metadata, at runtime (e.g., during emulation), to determine the particular regions of memory that are being accessed and/or the particular arguments (e.g., variables) from the original source code of the kernel that are being read and/or written. In particular embodiments, the metadata is incorporated into the device program binary. In particular embodiments, the metadata is incorporated into a package file including the device program binary and/or other binaries.

In block 725, the system may compile the HLL models of the static circuitry into the static circuitry binary. As part of block 725, the system is capable of including diagnostic program code within the static circuitry binary. Diagnostic program code may be included within one or more, or any combination of, the PCIe DMA model, the device memory model, the performance monitor model, and/or interconnect model(s). Operation of the diagnostic program code is described herein in greater detail in connection with FIGS. 9, 10, and 11.

In particular embodiments, the implementation options selected by the user in block 705 may specify particular diagnostic functions that the user wishes to utilize during emulation. The diagnostic functions may be associated with different diagnostic program code (e.g., program code modules) that are selectively incorporated into the static circuitry binary based upon the particular implementation options selected by the user.

In block 730, the system may optionally combine the device program binary and static circuitry binary into a package file. In one arrangement, the system may include metadata within the package file that indicates that the binary included therein is intended, or configured, for emulation as opposed to a binary that includes one or more configuration bitstreams. In another arrangement, the metadata may be written as part of the binary, whether a device program binary or a hardware binary. For example, the metadata may be an independent file that is encoded as part of the binary. In any case, the metadata may specify either emulation or hardware acceleration as the purpose for a given binary. The metadata may also specify the addressing information and correlation of addresses with kernel arguments as described herein.

In still another arrangement, the system may generate a script for executing the device program binary. Execution of the script causes the system (i.e., the system that executes the script) to launch or execute the RTL simulator. The script may be stored within the package file with the device program binary and the static circuitry binary. In another arrangement, a script may not be used and/or needed. For example, the emulation driver used by the host binary may be programmed to load the RTL simulator without the aid of a script.

In one arrangement, the device program binary may be referred to as an "XCLBIN" file. The device program binary may be used as an OpenCL binary program. In one aspect, the XCLBIN also may be used to implement real hardware that hardware accelerates program code in a hardware acceleration device or may be used for emulation as described herein. The OpenCL runtime used by the host binary at runtime may be configured to differentiate between XCLBINs configured for emulation and XCLBINs configured for actual hardware acceleration. For example, the OpenCL runtime may be configured or programmed to differentiate between two binary files such as a device program binary for emulation and a hardware binary that includes configuration bitstreams for loading in a programmable IC for actual hardware acceleration.

In one or more embodiments, each XCLBIN file, whether configured for emulating hardware and/or implementing an actual hardware accelerator, is specific to a particular hardware acceleration device. As such, the XCLBIN file that is configured for emulation of one particular hardware acceleration device may not be used to emulate another, different hardware acceleration device.

If additional device program binaries are to be generated, method 700, or portions thereof such as block 720, may be repeated as may be required to generate further device program binaries. It should be appreciated, however, that compiling the host program code need not be performed for each iteration when generating additional device program binaries for emulation. The host program code need not be recompiled.

Figure 8:
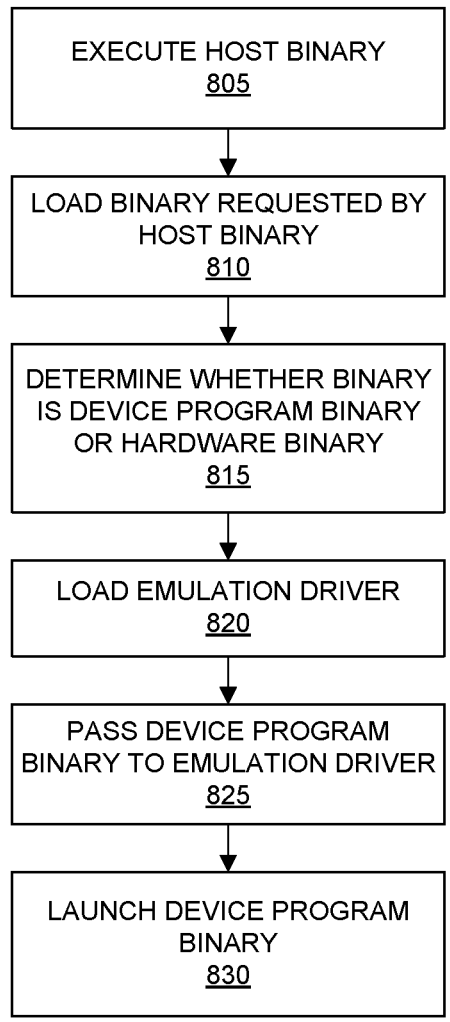
FIG. 8 illustrates another example method for emulating an application that uses hardware acceleration.

FIG. 8 illustrates another example method 800 of emulating an application that uses hardware acceleration. Method 800 illustrates "runtime" operations. More particularly, method 800 illustrates operations that may be performed by a data processing system (system) at runtime of emulation to emulate execution of an application that uses hardware acceleration.

In block 805, the system begins executing the host binary. The host binary may be executed in a first process of the system. In block 810, the system may load a binary. The binary may be one that is requested by the host binary. For example, the requested binary may include one or more kernels requested for execution by the host binary. The binary may be a hardware binary or a device program binary.

In one arrangement, an OpenCL runtime may load the binary as one that is a binary implementation of a kernel that the host binary wishes to execute. For example, the OpenCL runtime may load the XCLBIN file for a particular kernel. The OpenCL runtime may be provided by the hardware accelerator provider (e.g., the provider of the circuit board and/or the programmable IC) as a library that may be used by and/or included within the host binary. As such, the OpenCL runtime may execute within the first process with the host binary.

In block 815, the system may determine whether the binary for the kernel(s) requested by the host binary is configured for emulation, i.e., is a device program binary, or is configured for hardware acceleration, i.e., is a hardware binary that includes a configuration bitstream. In either case, the binary may be for a first kernel. In one arrangement, the OpenCL runtime may determine that the binary is configured for emulation. For example, the OpenCL runtime may read the metadata that may be stored within a package file including the device program binary or other binary or stored therein as part of the device program binary or other binary. The OpenCL runtime may be configured to read the metadata to determine whether the binary is a device program binary or a hardware binary as described from the metadata.

In block 820, responsive to determining that the binary is a device program binary, the system may load an emulation driver. For example, the OpenCL runtime may load the emulation driver. The particular driver that is selected and loaded by the OpenCL runtime may be one that is associated, or paired, with the binary of block 810. In this case, since the binary is a device program binary, the driver is an emulation driver. In the event the binary is a hardware binary, the driver is a hardware acceleration device driver. The OpenCL runtime may select the emulation driver from a plurality of available drivers, where the available drivers may include one or more emulation drivers and/or one or more hardware acceleration drivers. As noted, each driver may be associated with a particular binary or binaries.

In one arrangement, the emulation driver may be implemented like any other hardware acceleration driver in that the emulation driver may implement a standard set of APIs. The APIs may be used by the host binary and/or the OpenCL runtime. In one or more embodiments, the APIs are not specific to emulation. For example, the same APIs may be used for the emulation driver and an actual hardware acceleration driver that may be used by the host binary for communicating with an actual hardware acceleration device. In this regard, the host binary may execute as is normal without being aware that it is communicating with an emulation target as opposed to an actual hardware acceleration device. The OpenCL runtime, not the host binary, may recognize that emulation is performed at least for the device program binary.

In block 825, the host binary may pass the device program binary to the emulation driver. The host binary may pass the device program binary to the emulation driver using a standard API. In one arrangement, the host binary may pass the device program binary responsive to attempting to execute the particular kernel designated for hardware acceleration that is being emulated by the device program binary.

In block 830, the emulation driver may launch or execute the RTL simulator of the device program binary. In one or more embodiments, the RTL simulator may be executed in a second, different process. In one example, the emulation driver may extract the script from the device program binary or package file as the case may be. The emulation driver may execute the script, which launches, or initiates execution of the RTL simulator. In another example, the emulation driver may execute the RTL simulator without the use of a script as previously noted. The RTL simulator may be launched or executed and may execute in a second, different process of the system. As such, the host binary and the RTL simulator (the device program binary) execute concurrently in different processes.

The device program binary may load and/or execute the static circuitry binary as may be required during emulation. As noted, the static circuitry binary may be a dynamic link library file or files. The static circuitry binary may execute in the same process as the device program binary.

In one or more embodiments, the emulation driver is capable of utilizing the metadata to communicate with the device program binary. For example, the emulation driver is capable of allocating different buffers for communication with the device program binary. The buffers may be allocated in RAM 206 as represented by device memory model 404. The metadata is capable of specifying a mapping of hardware addresses to kernel arguments (e.g., variable names) as described herein in greater detail below.

As part of conducting emulation, the static circuitry binary may generate one or more HLL transactions. The HLL transactions may be translated into RTL signals and provided to the RTL simulator. Further, the RTL simulator may generate RTL signals. The RTL signals may be translated to HLL transactions and provided to the static circuitry model(s).

Further device program binaries may be loaded as may be required as illustrated in FIG. 6. For example, responsive to determining that a further or second device program binary is configured for emulating hardware acceleration of a second kernel, the OpenCL runtime may load a second emulation driver for the host binary. A further, or second, RTL simulator for the second kernel may be executed in a further, e.g., a third process of the computing system. In another aspect, the second RTL simulator may be executed in the same process, i.e., the second process, in which the first RTL simulator is executed. Executing the second RTL simulator (e.g., second device program binary) in the third process provides additional isolation from the other device program binaries. The host binary may communicate with the first RTL simulator through the first emulation driver concurrently with communicating with the second RTL simulator through the second emulation driver. As also noted, the host binary may communicate with a hardware acceleration device using a hardware acceleration device driver concurrently with communicating with the RTL simulator(s) through the emulation driver(s).

In one arrangement, the host binary may create a unique identifier (ID) that may be provided to the emulation driver. The emulation driver and the device program binary may use the unique ID to communicate. The unique ID may be changed based on the type of communication channel used. For example, the unique ID may be changed according to whether file based sockets, TCPIP sockets, or the like are used. Use of the unique ID allows the emulation driver to communicate with two or more independent device program binaries concurrently.

With the RTL simulator executing, the emulation driver may communicate with the RTL simulator using IPC through specialized communication APIs. When the host binary is finished using, or accessing, a particular kernel (e.g., the device program binary), the host binary may call an API of the emulation driver to release the RTL simulator. The emulation driver may shut down or otherwise terminate execution of the RTL simulator and/or unload the device program binary from execution memory. Execution of other device program binaries and/or usage of other hardware accelerators may continue uninterrupted. Subsequently, the host binary may load another device program binary, e.g., another XCLBIN, corresponding to another hardware acceleration device as may be needed for emulation purposes.

In another arrangement, one or more of the callback APIs of the emulation driver may be called by the OpenCL runtime at a regular interval during emulation. For example, an API for pinging, or determining, the status of the device program binary, reading back profiling information, or the like may be called by the OpenCL runtime at regular intervals. Since execution of the device program binary (e.g., an emulation target) may be significantly slower than executing on an actual hardware acceleration device, an execution ratio between the device program binary (emulation) and the physical hardware acceleration device being emulated may be determined. As an illustrative example, an execution ratio of 50 indicates that the device program binary operates at 1/50th the speed of an actual hardware accelerator device. Accordingly, in only 1 out of 50 instances of invoking the callback function is the callback function actually executed. Thus, once out of every 50 periodical HAL driver callbacks are actually executed. In the other 49 instances, the emulation driver function call may return immediately with cached results from the previous execution of that function call.

In another arrangement, the OpenCL runtime may monitor the speed of emulation. The OpenCL runtime may adjust and/or recalculate the ratio of emulation speed to speed of actual hardware acceleration device operation (which may be stored as a fixed parameter) as emulation continues using the newly determined speed of emulation. In this manner, the OpenCL runtime may dynamically adjust the execution ratio thereby changing the frequency of implemented callbacks using the different ratios.

In another arrangement, the device program binary may be configured to remove or minimize the notion of latencies. For example, the static circuitry binary may allow a user to specify one or more latency or delay settings. Removing, or zeroing out, the latencies does not affect the functional correctness of the static circuitry binary since the protocol accuracy is still preserved between different modeled circuit blocks of the static circuitry. The algorithm to calculate latency for a circuit block, for example, may be separate from the usage of those latencies during emulation.

In one aspect, the configuration of latencies may be controlled through a configuration file, environment variables, or the like. Thus, a user may switch from an emulation of the static circuitry that uses latencies to a purely functional and untimed emulation for the static circuitry thereby significantly speeding up the execution speed. For purposes of illustration, in early stages of emulation, a user may be concerned with the correct compilation of code. As the development progresses, the user may wish to reduce and/or remove latencies of one or more different models, e.g., the interconnect models. The user may still emulate functionality and control latency on an individual HLL model basis. For example, the user may control latencies of each of the interconnect models, PCIe DMA model, device memory model, and/or performance models independently. Execution of one or more models during emulation may be sped up by reducing latency of such models while keeping latencies in place for one or more other models of interest.

Changing latencies may also aid in accounting for emulating circuitry of the circuit board. For example, a larger latency for the PCIe DMA model may account for latency in the circuitry of the circuit board in addition to static circuitry in the programmable IC.

In another arrangement, cross triggering between the host binary and the device program binary may be performed. For example, one or more break points may be set in the host program code and/or in the kernel. The RTL simulator may be executed in an interactive mode that provides visibility of operation to the user. If a break point is set within the host program code, the OpenCL runtime may, upon encountering the break point, communicate the break point to the emulation driver. Responsive to the communication, the emulation driver may halt execution of a simulation engine of the RTL simulator through IPC. The user may then query the state of device program binary.

Similarly, a break point may be set in the RTL implementation of the kernel. The break point may be set directly in the RTL simulator using an interactive shell and/or graphical user interface. As the RTL simulator execution halts responsive to encountering the break point, execution of the host binary is also halted as the next attempted communication from the host binary will not receive a response from the device program binary while halted. The user may then determine the circumstances that a particular part of the hardware acceleration device (e.g., a circuit block modeled by the HLL models) is exercised.

Figure 9:
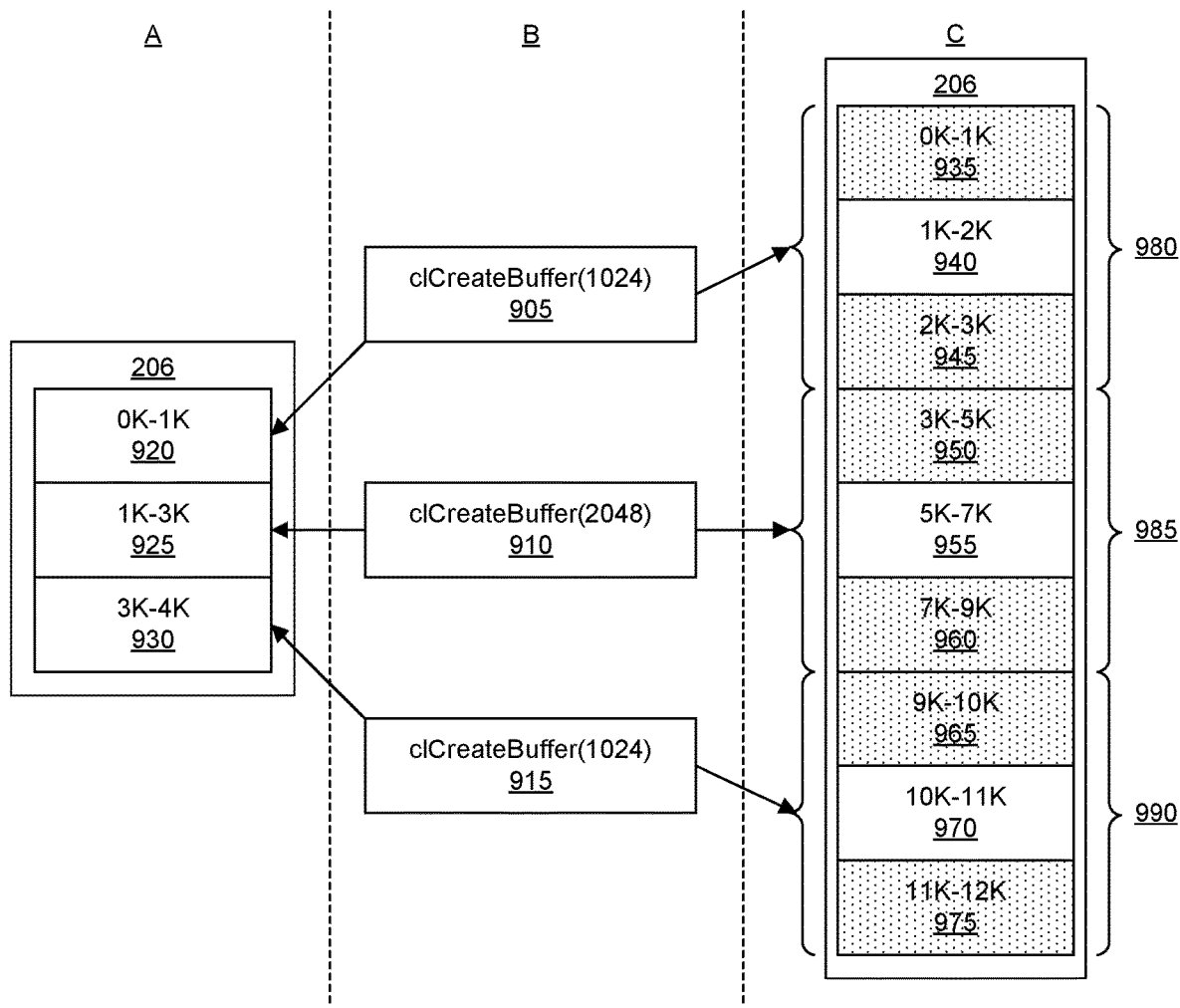
FIG. 9 illustrates an example of detecting an error condition relating to a kernel memory access.

FIG. 9 illustrates an example of detecting an error condition relating to kernel memory. Listing 1 shows example metadata for a kernel that is generated during compilation of the kernel. For example, the metadata of Listing 1 may be created as described during compilation 355 described in connection with FIG. 3 or in step 720 described in connection with FIG. 7.

Listing 1

```
<args>
  <arg name="a" addressQualifiers="1" id="0"
    port="M_AXI_GMEM" size="0x8" offset="0x10"
    hostOffset="0x0" hostSize="0x8" type="int*"/>
  <arg name="b" addressQualifiers="1" id="1"
    port="M_AXI_GMEM" size="0x8" offset="0x1C"
    hostOffset="0x0" hostSize="0x8" type="int*"/>
  <arg name="output" addressQualifiers="1" id="2"
    port="M_AXI_GMEM" size="0x8" offset="0x28"
    hostOffset="0x0" hostSize="0x8" type="int*"/>
</args>
```

The example metadata of Listing 1 specifies the arguments corresponding to a kernel. The arguments of the kernel are the variables that are specified as arguments within the function that is executed by the host (e.g., host binary in this example) to call or invoke the kernel. In the example of Listing 1, the kernel receives the arguments "a" and "b" as inputs from the host (e.g., host binary) and provides the argument "output" as an output to the host. The metadata specifies the address at which the buffer for passing each of arguments "a", "b", and "output" is located and the size of each respective argument. The buffer size may be specified elsewhere within the host program code.

Referring to FIG. 9, when the host binary invokes a kernel, e.g., a device program binary in the case of emulation, the emulation driver allocates buffers for storing the arguments passed between the host and the kernel during emulation. In the example of FIG. 9, the host binary provides host instructions at runtime to allocate the buffers. For example, the host binary executes functions 905, 910, and 915 in column B during emulation to allocate buffers for each of arguments "a", "b", and "output", respectively, of the kernel.

Column A illustrates the result of allocating buffers within RAM 206 (e.g., device memory model 404) during emulation where no diagnostic program code is used for purposes of detecting memory access violations. As shown, function 905 allocates buffer 920 having an address range of 0K to 1K. Buffer 920 is allocated for argument "a". Function 910 allocates buffer 925 having address range 1K to 3K. Buffer 925 is allocated for argument "b". Function 915 allocates buffer 930 having an address range of 3K to 4K. Buffer 930 is allocated for argument "output". In column A, buffers 920, 925, and 930 are contiguous. As shown, no space exists between buffer 920 and buffer 925. No space exists between buffer 925 and buffer 930.

In one or more embodiments, the emulation driver is capable of reading and/or parsing the metadata from Listing 1 to determine the arguments "a", "b", and "output" for the kernel. The emulation driver is further capable of determining the offset for each of the arguments "a", "b", and "output" as illustrated below in Listing 2.

Listing 2 offsetMap[0x10]=(0x8, a)
offsetMap[0x1C]=(0x8,b)
offsetMap[0x28]=(0x8, output)

Column C illustrates an example of allocating buffers within RAM 206 (e.g., device memory model 404) during emulation when diagnostic program code is used for purposes of detecting certain types of memory access violations. Column C illustrates that the emulation driver has allocated buffer regions 980, 985, and 990 for arguments "a", "b", and "output", respectively, of the kernel. Each of buffer regions 980, 985, and 990 includes a buffer that is allocated for the argument (or variable). In the example of FIG. 9, each of buffer regions 980, 985, and 990 include a buffer pad on each side of the allocated buffer (e.g., starting at an address immediately above and starting at an address immediately below the allocated buffer). For purposes of illustration, the buffers used for storing data corresponding to the arguments are not shaded, while the buffer pads on each side of the buffers are shown with shading.

For example, buffer region 980 includes a buffer pad 935 having address range 0K to 1K, a buffer 940 having address range 1K to 2K, and a buffer pad 945 having an address range of 2K to 3K. Data corresponding to argument "a" is stored in buffer 940. Buffer region 985 includes a buffer pad 950 having address range 3K to 5K, a buffer 955 having address range 5K to 7K, and a buffer pad 960 having an address range of 7K to 9K. Data corresponding to argument "b" is stored in buffer 955. Buffer region 990 includes a buffer pad 965 having address range 9K to 10K, a buffer 970 having address range 10K to 11K, and a buffer pad 975 having an address range of 11K to 12K. Data corresponding to argument "output" is stored in buffer 970. The buffer allocation shown in column C is performed at runtime by the emulation driver in response to invoking the kernel and calling functions 905, 910, and 915.

In one or more embodiments, emulation driver generates the buffer regions to be continuous. For example, within each buffer region, each buffer pad is located immediately adjacent to the buffer of the buffer region. Further, each of buffer regions 980, 985, and 990 may be located immediately adjacent to one another as pictured in the example of FIG. 9.

Listing 3 specifies a mapping of memory locations for the buffers to be allocated to the particular arguments exchanged with the kernel. During emulation, the emulation driver is capable of generating the information illustrated in Listing 3 and providing the information of Listing 3 to one or more modules of static circuitry binary 350. The emulation driver is capable of providing the information of Listing 3 to static circuitry binary 350. For example, the emulation driver is capable of providing the information of Listing 3 to PCIE DMA model 402, device memory model 404, performance monitor model 406, interconnect model 408, and/or interconnect model 410.

Listing 3 regMap[0x10]=1K
regMap[0x1C]=5K
regMap[0x28]=10K
AddrNameMap[0,3K]=a
AddrNameMap[3K,9K]=b
AddrNameMap[9K,12K]=output As illustrated, the information in Listing 3 correlates the arguments of the kernel with particular buffers and with particular addresses within the device memory model. Using the information specified in Listing 3, diagnostic program code included in any of the models of static circuitry binary 350 is capable of determining the particular argument involved in a given read operation and/or a given write operation based upon the address of the read/write that is detected.

Figure 10:
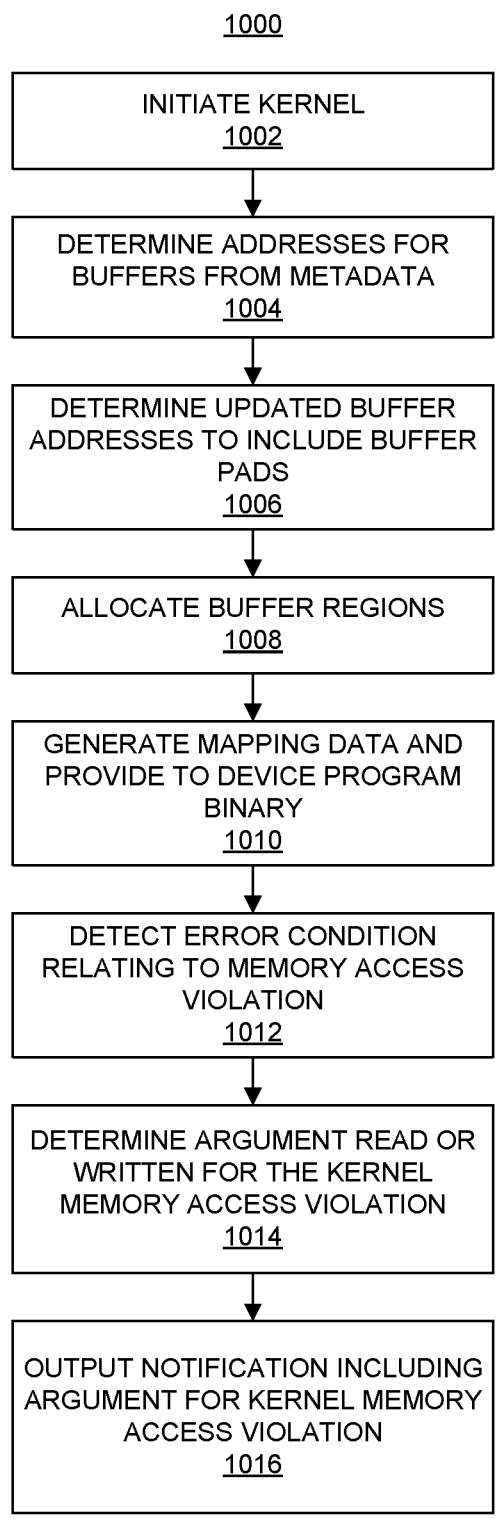
FIG. 10 illustrates another example method for emulating an application that uses hardware acceleration.

FIG. 10 illustrates an example method 1000 of performing emulation. For purposes of discussion, method 1000 may be implemented by a system performing emulation using the architecture described in connection with FIG. 5. Accordingly, in the example of FIG. 10, the host binary, the static circuitry binary, and the device program binary are executing.

In block 1002, the host binary initiates a kernel. For example, the host binary executes a function that invokes a hardware accelerated kernel emulated by the device program binary that is specified. In block 1004, the emulation driver determines the addresses for the buffers to be allocated for the arguments of the kernel from the metadata generated when compiling the kernel.

In block 1006, the emulation driver is capable of determining the updated buffer addresses to include buffer pads. In one or more embodiments, each buffer that is to be allocated is surrounded by buffer pads. For example, each buffer to be allocated may have a buffer pad immediately above (e.g., in terms of memory addresses) and immediately below as illustrated in FIG. 9.

In block 1008, the emulation driver is capable of allocating buffer regions. The emulation driver is capable of creating buffer regions within the device memory model for passing arguments of the kernel between the host binary and the device program binary. As described in connection with FIG. 9, each buffer region includes a buffer pad, followed by a buffer, followed by another buffer pad.

In block 1010, the emulation driver generates mapping data for the allocated buffer regions. Further, the emulation driver is capable of providing the mapping data to the static circuitry binary. An example of the mapping data provided from the emulation driver to the static circuitry binary is described in connection with Listing 3. The mapping data specifies addresses of buffer regions and/or buffers and buffer pads included therein. The mapping data further correlates the buffer regions to particular arguments of the kernel. For example, each buffer region, which includes two buffer pads and one buffer, is allocated to a particular argument of the device program binary.

In block 1012, the static circuitry binary is capable of detecting an error condition relating to a memory access violation. As an illustrative and non-limiting example, a memory access violation includes reading or writing from a buffer pad as opposed to the buffer itself in the device memory model. Diagnostic program code in the device memory model, for example, is capable of determining whether the address of a detected read operation and/or a write operation falls within a buffer pad indicating a memory access violation based upon a comparison of the address for the memory operation with the mapping data.

In block 1014, the static circuitry binary is capable of determining the argument that is read or written for the memory access violation. The static circuitry, for example, is capable of using the mapping data to determine the particular buffer that was access or attempted to access and, based upon the address, determine the argument mapped to the buffer.

In block 1016, the static circuitry binary is capable of outputting a notification of the memory access violation. The static circuitry binary is capable of generating the notification. The notification may indicate information such as the memory operation that was detected, the address that was read and/or written, and/or the particular argument of the kernel program code that was the subject of the memory operation (e.g., the argument associated with the buffer that was accessed). The notification may be generated in any of a variety of different formats. In one or more embodiments, the static circuitry binary is capable of generating a console notification. In another example, the static circuitry is capable of writing the notification to a log file.

In one or more embodiments, the device program binary is capable of including diagnostic program code that indicates the particular argument that is being read or written when a memory operation is initiated. For example, each kernel, when implemented as a device program binary, includes an internal state machine that may be exposed or configured to specify the particular argument that is the subject of a read operation and/or a write operation. In cases where the device program binary is capable of specifying which argument is the subject of a read operation or a write operation, the static binary circuitry may receive such data directly from the device program binary itself in lieu of performing any lookup or cross-referencing using the mapping data as described.

Figure 11A:
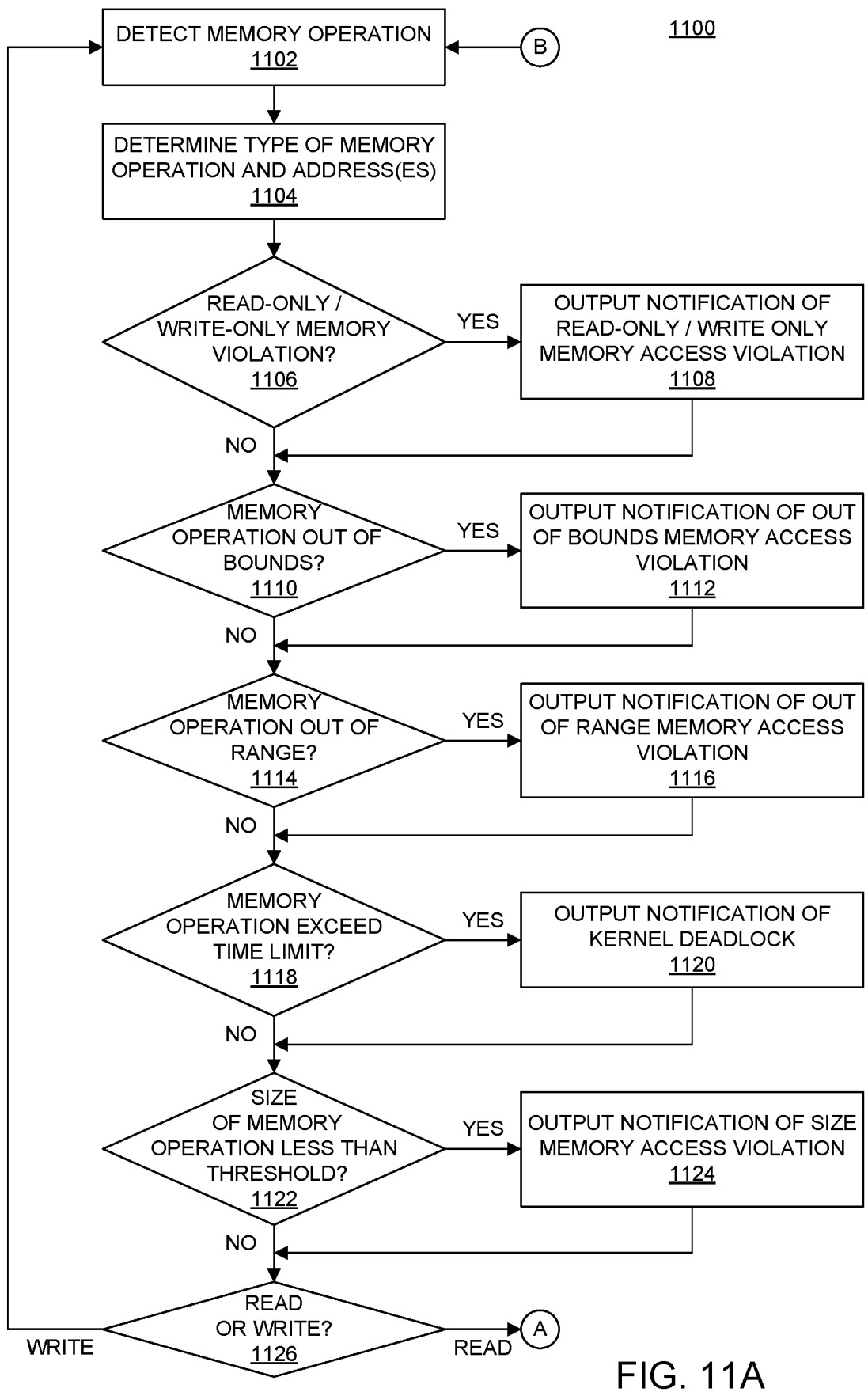
FIGS. 11A and 11B, taken collectively, illustrate another example method for emulating an application that uses hardware acceleration.
Figure 11B:
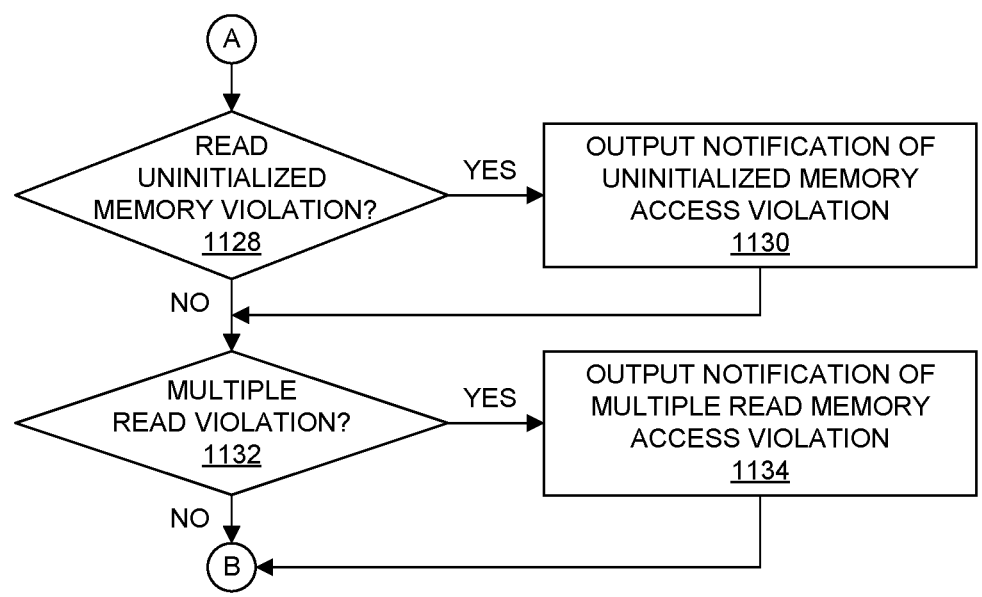

FIGS. 11A and 11B, taken collectively, illustrate another example method 1100 of performing emulation. For purposes of discussion, method 1100 may be implemented by a system performing emulation using the architecture described in connection with FIG. 5. Accordingly, in the example of FIG. 11, the host binary, the static circuitry binary, and the device program binary are executing. Method 1100 illustrates the detection and processing of various types of error conditions.

In block 1102, the static circuitry binary detects a memory operation. For example, the PCIe DMA model and/or the device memory model is capable of detecting a memory operation directed to the device memory model. In block 1104, the static circuitry binary determines the type of memory operation and the addresses involved. For example, the static circuitry binary is capable of determining whether the detected memory operation is a read operation or a write operation. In addition, the static circuitry binary is capable of determining the address and/or addresses to be read or written as the case may be.

In block 1106, the static circuitry binary determines whether a read-only or a write-only memory violation is detected. A read-only memory violation and a write-only memory violation are examples of memory access violations. For example, buffers allocated for particular arguments of the kernel may be designated as read-only or as write-only within the device memory model. Referring to the prior example, buffers allocated for the kernel inputs of "a" and "b" may be designated as read-only from the perspective of the kernel, e.g., the kernel may only read from read-only buffers to receive inputs from the host. The buffer allocated to the output called "output" may be designated as a write-only from the perspective of the kernel, e.g., the kernel may only write to the write-only buffers to provide output to the host. In response to detecting that the device program binary attempted to read from a write-only buffer in the device memory model, the device memory model is capable of detecting a write-only type of memory access violation. Similarly, in response to detecting that the device program binary attempted to write to a read-only buffer in the device memory model, the device memory model is capable of detecting a read-only type of memory access violation.

In response to detecting a violation in block 1106, method 1100 continues to block 1108. In block 1108, the static circuitry binary is capable of outputting a notification specifying the detected read-only or write-only type of memory access violation based upon the particular violation detected in block 1106. The notification may specify which argument of the kernel is being read and/or written when the violation is detected. If no violation is detected method 1100 continues to block 1110.

In block 1110, the static circuitry binary is capable of determining whether a memory operation is out of bounds. An out of bounds memory operation is another example of a memory access violation. As described in connection with FIG. 9, the device memory model is capable of receiving mapping data that correlates particular buffer regions and addresses of such buffer regions and any buffers and/or buffer pads included in such buffer regions, with particular arguments of the kernel that is being invoked. Accordingly, the device memory model is capable of checking whether a memory access performed by the device program binary, e.g., a read operation or a write operation, for a given argument is within the bounds of the buffer allocated for that argument. The device memory model is capable of detecting when the device program binary attempts to access an address of the device memory model that is outside of the bounds of the buffer allocated for the particular argument that is being read and/or written.

For example, the device memory model is capable of detecting when the device program binary attempts to read from a buffer pad of a buffer region. In one or more embodiments, detecting a read or write to a buffer pad region by the device program binary triggers a memory operation out of bounds violation. In particular embodiments, the device memory model is capable of determining the particular argument that was the subject of the read operation or the write operation.

As discussed in connection with FIG. 9, in one or more other embodiments, the device program binary is capable of exposing the current state of the state machine contained therein when initiating a memory operation. In doing so, the device program binary is capable of specifying the particular argument that is the subject of the memory operation being initiated. In that case, the static circuitry binary, whether the PCIe DMA model and/or the device memory model, is capable of receiving information directly from the device program binary indicating the particular argument that is the subject of the memory operation. Accordingly, the static circuitry binary need not reference any meta data received from the emulation driver in order to determine the particular argument that is the subject of the memory operation. It should be appreciated that while exposing the internal state machine of the device program binary is described in connection with block 1110, exposing the state machine data as described may be utilized in detecting the particular arguments that are the subject of any of the various memory access violations described within this disclosure.

In response to detecting a violation in block 1110, method 1100 continues to block 1112. In block 1112, the static circuitry binary is capable of outputting a notification specifying the detected out of bounds type of memory access violation. The notification may specify which argument of the kernel is being read and/or written when the violation is detected. If no violation is detected in block 1110, method 1100 continues to block 1114.

In block 1114, the static circuitry binary is capable of detecting whether a memory operation is out of range. An out of range memory operation is another example of a memory access violation. An out of range memory operation refers to the case where the device program binary attempts to read from the device memory model using an address that does not exist within the device memory model. In one or more embodiments, interconnect models such as interconnect model 408, is capable of parsing received memory operations directed to the device memory model and determining whether the address specified for the memory operation, whether a read operation or a write operation, exists within device memory model. In response to determining that the address of the memory operation does not exist within device memory model, the interconnect model is capable of detecting an out of range type of memory access violation.

In response to detecting a violation in block 1114, method 1100 continues to block 1116. In block 1116, the static circuitry binary is capable of outputting a notification specifying the detected out of range type of memory access violation. The notification may specify which argument of the kernel is being read and/or written when the violation is detected. If no violation is detected in block 1114, method 1100 continues to block 1118.

In block 1118, the static circuitry binary is capable of detecting that a memory operation has exceeded a time limit. A memory operation, whether a read operation and/or a write operation, that has not completed within a predetermined amount of time referred to as the time limit is an indication of kernel deadlock, i.e., in this case the device program binary being deadlocked.

In one or more embodiments, the deadlock condition may be detected at a data path circuit block. Examples of data path circuit blocks include, but are not limited to, interconnect circuit blocks, DMA circuit blocks, PCIe circuit blocks, first-in-first-out (FIFO) memory circuit blocks, and other circuit blocks used in the conveyance of data among kernels and/or memory. In the case of the static circuitry binary, one or more of the models contained therein may include diagnostic program code capable of measuring the amount of simulation time for memory operations to complete. For example, an interconnect model and/or the PCIe DMA model may include diagnostic program code that begins a counter (in simulation time) in response to detecting the start of a memory operation such as a read or a write. In response to the counter reaching some predetermined value prior to the detected memory operation completing, the model is capable of detecting a kernel deadlock.

One example of a kernel deadlocking relates to the size of the FIFO memories included therein. The kernel may include FIFO memories that are used to cache data from global memory (e.g., RAM 206 as represented by device memory model 404). In cases where the FIFO memories are too small, read operations issued from the device program binary may not complete. Thus, detecting a read transaction of the kernel that does not complete prior to the time limit indicates that the kernel has deadlocked internally.

As an illustrative and non-limiting example, assume that the FIFO memory within the device program binary has a depth of 4. The device program binary, during emulation, reads a burst of 32 words causing the internal FIFO memory to be overwritten. In this example, the FIFO memory is too small. As such, only 4 words are available and the rest of the data is lost. When the device program binary attempts to write the results from the FIFO memory, the device program binary (e.g., kernel) expects to fetch 32 words but is only able to fetch the 4 words available in the FIFO memory. The device program binary enters a hang state waiting to fetch the remaining data leading to an unfinished write operation, which may be detected and reported.

In response to detecting a violation in block 1118, method 1100 continues to block 1120. In block 1120, the static circuitry binary is capable of outputting a notification specifying the kernel deadlock error condition. The notification may specify which argument of the kernel is being read and/or written when the deadlock. If no violation is detected in block 1118, then method 1100 continues to block 1122.

In block 1122, the static circuitry binary is capable of detecting memory operations having a size that is less than a threshold size. For example, the interface to the memory such as a memory controller or a DMA controller is often capable of reading a minimum number of bits from a memory each clock cycle and/or writing the minimum number of bits to the memory each clock cycle. In cases where a circuit accesses a memory interface and reads and/or writes a number of bits that is less than, or continually less than, the threshold amount, the situation indicates that the kernel is operating at reduced efficiency.

In the instant case, the number of bits that the PCIe DMA model is capable of writing to the device memory model and/or reading from the device memory model in one instance (e.g., one simulation clock cycle) may be used as the threshold size. The device memory model, for example, is capable of determining the size of memory operations directed thereto from the device program binary and comparing the amount of data (e.g., number of bits or bytes) to be read and/or written with the threshold size. In response to determining that the device program binary reads and/or writes a particular address one or more times with data amounts that are less than the threshold size, the device memory model detects a memory size violation.

In response to detecting a violation in block 1122, method 1100 continues to block 1124. In block 1124 the static circuitry binary is capable of outputting a notification specifying a size type of memory access violation. The notification may specify which argument of the kernel is being read and/or written when the violation is detected. If no violation is detected in block 1122, then method 1100 continues to block 1126.

In block 1126, the static circuitry binary is capable of branching based upon the type of memory operation that is detected. For example, if a read operation is detected, method 1100 continues to block 1128. If a write operation is detected, method 1100 may loop back to block 1102 to continue processing.

In block 1128, the static circuitry is capable of detecting a read operation from an initialized memory within the device memory model. In one or more embodiments, the device memory model is capable of tracking which addresses contained therein have been written by the host binary and/or the device program binary throughout emulation. Addresses of the device memory model that have not been written by either the host binary or the device program binary during emulation are considered on initialized memory. The device memory model is capable of determining instances where the device program binary initiates a read operation from an address contained within the device memory model that has not yet been written by either the host binary or the device program binary. In response to detecting that the device program binary has initiated or performed a read operation from uninitialized memory within the device memory model, the device memory model determines that an uninitialized memory violation has occurred.

In response to detecting the violation in block 1128, method 1100 continues to block 1130. In block 1130, the static circuitry binary is capable of outputting a notification specifying the detected uninitialized type of memory access violation. The notification may specify which argument of the kernel is being read when the violation is detected. If no violation is detected in block 1128, method 1100 continues to block 1132.

In block 1132, the static circuitry is capable of detecting a multiple read type of memory access violation. As discussed in connection with block 1128, the device memory model is capable of tracking reads and writes to the addresses contained therein. In cases where the device program binary reads the same address of the device memory model two or more consecutive times without an intervening write operation by either the kernel binary or the device program binary to the same address that is being read, the device memory model is capable of detecting a multiple read type of memory access violation. A multiple read type of memory access violation indicates that the device program binary is operating in an inefficient manner as caching of the data that is continually being read would likely improve runtime performance of the kernel.

If a violation is detected in block 1132, method 1100 continues to block 1134. In block 1134, the static circuitry binary is capable of outputting a notification specifying the detected multiple read type of memory access violation. The notification may specify which argument of the kernel is being read when the violation is detected. If no violation is detected in block 1132, and after block 1134, method 1100 continues to block 1102 to continue processing further memory operations.

In one or more embodiments, the static circuitry binary is capable of detecting dependencies between consecutive iterations of a loop. In some cases, a kernel (e.g., kernel program code 315) may include a directive (e.g., a pragma) for the compiler that explicitly specifies that iterations of the loop are not dependent upon one another. For example, such a directive informs the processor that data that is generated from a first iteration of the loop is not provided as input to a next iteration of the loop. The inclusion of the directive provides hardware compilers with increased flexibility when implementing hardware. In accordance with the inventive arrangements described herein, the static circuitry binary is capable of detecting those situations where such a directive is included in the kernel, but a dependency is detected among consecutive iterations of a loop of the kernel during emulation.

In an illustrative and non-limiting example, the static circuitry binary is capable of detecting a dependency by detecting a write from previous iteration of the loop followed by a read in the next iteration of the loop. In response to detecting this pattern in cases where the user has provided a directive indicating no dependency, the static circuitry binary is capable of flagging the detected dependency as being in conflict with the user specified directive.

Figure 12:
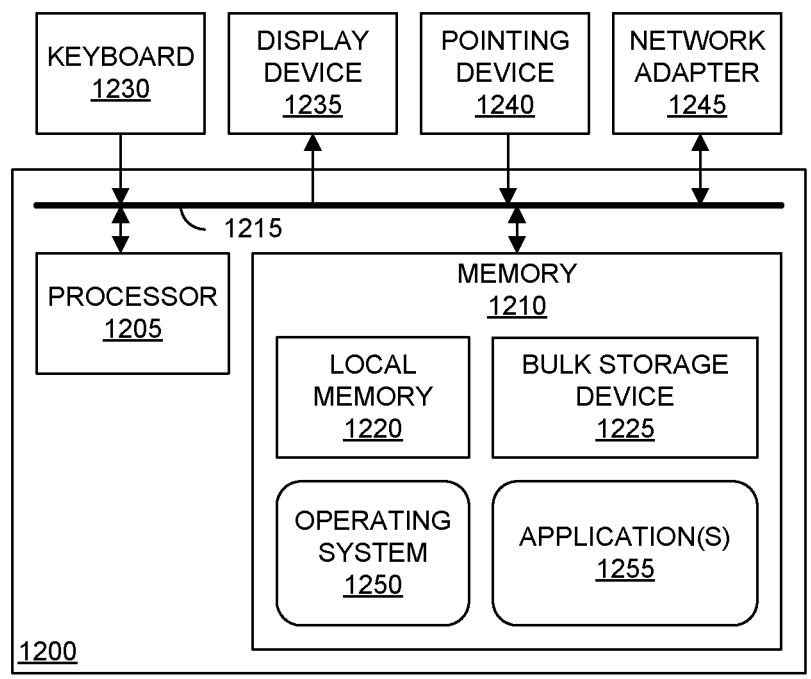
FIG. 12 is a block diagram illustrating an example of a data processing system.

FIG. 12 is a block diagram illustrating an example of a data processing system (system) 1200. System 1200 may be used to perform compilation operation as described in connection with FIGS. 3 and 7. System 1200 may be used to perform emulation by executing the architectures described in connection with FIGS. 4, 5, and/or 6 and/or by performing operations described in connection with FIGS. 8, 9, 10, and 11.

As pictured, system 1200 includes at least one processor, e.g., a central processing unit (CPU), 1205 coupled to memory 1210 through a system bus 1215 or other suitable circuitry. System 1200 stores computer readable program instructions (also referred to as "program code") within memory 1210. Memory 1210 may be considered an example of computer readable storage media. Processor 1205 executes the program code accessed from memory 1210 via system bus 1215.

Memory 1210 may include one or more physical memory devices such as, for example, a local memory 1220 and one or more bulk storage devices 1225. System 1200 may also include one or more cache memories (not shown). I/O devices such as a keyboard 1230, a display device 1235, a pointing device 1240, and one or more network adapters 1245 may be coupled to system 1200. The I/O devices may be coupled to system 1200 either directly or through intervening I/O controllers. In some cases, one or more of the I/O devices may be combined as in the case where a touchscreen is used as display device 1235. In that case, display device 1235 may also implement keyboard 1230 and pointing device 1240. Network adapter 1245 may be used to couple system 1200 to other systems, computer systems, remote printers, and/or remote storage devices through intervening private or public networks. Depending upon the particular implementation of system 1200, the specific type of network adapter, or network adapters as the case may be, will vary.

As pictured in FIG. 12, memory 1210 may store an operating system 1250 and one or more applications 1255. In one aspect, application 1255 may be an EDA application. In another aspect, application 1255 may be one or more compilers of the varieties described herein. Operating system 1250 and application 1255, being implemented in the form of executable program code, may be executed by system 1200 and, in particular, by processor 1205. As such, operating system 1250 and application 1255 may be considered an integrated part of system 1200. Operating system 1250, application 1255, and any data items used, generated, and/or operated upon by system 1200 are functional data structures that impart functionality when utilized by system 1200.

In one aspect, system 1200 may be a computer or other device that is suitable for storing and/or executing program code. System 1200 may represent any of a variety of computer systems and/or devices that include a processor and memory and that are capable of performing the operations described within this disclosure. In some cases, the particular computer system and/or device may include fewer components or more components than described. System 1200 may be implemented as a single system as shown or as a plurality of networked or interconnected systems each having an architecture the same as, or similar to, that of system 1200.

The inventive arrangements disclosed within this specification may be utilized in other instances of hardware acceleration. For example, in some cases, program code may be executed by a processor within an SOC type of IC that also includes programmable circuitry. Some FPGAs, for example, may include programmable circuitry and a processor capable of executing program code. In that case, the "heterogeneous computing platform" may be the SOC itself. The host program code may execute in the processor of the SOC. Hardware accelerated kernels may be implemented in the programmable circuitry of the SOC. The static circuitry that is modeled may be entirely within the SOC and model interfaces with the processor. In such an example, the application may be emulated as described herein, where the device program binary represents the hardware accelerated kernels and interfaces with the processor of the SOC.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without user intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "hardware description language" or "HDL" refers to a computer-language that facilitates the documentation, design, and manufacturing of a digital system, such as an integrated circuit. An HDL combines program verification techniques with expert system design methodologies. Using an HDL, for example, a user can design and specify an electronic circuit, describe the operation of the circuit, and create tests to verify operation of the circuit. In general, an HDL includes standard, text-based expressions of the spatial and temporal structure and behavior of the electronic system being modeled. HDL syntax and semantics include explicit notations for expressing concurrency. In contrast to most high-level programming languages, an HDL also includes an explicit notion of time, which is a primary attribute of a digital system. An HDL description of circuitry is one example of a register transfer level (RTL) description of the circuitry.

As defined herein, the term "high-level programming language" means a programming language, or set of instructions, used to program a data processing system where the instructions have a strong abstraction from the details of the data processing system, e.g., machine language. For example, a high-level programming language may automate or hide aspects of operation of the data processing system such as memory management. The amount of abstraction typically defines how "high-level" the programming language is. Using a high-level programming language frees the user from dealing with registers, memory addresses, and other low-level features of the data processing system upon which the high-level programming language will execute. In this regard, a high-level programming language includes little or no instructions that translate directly, on a one-to-one basis, into a native opcode of a data processing system. Examples of high-level programming languages include, but are not limited to, C, C++, SystemC, OpenCL, Matlab, or the like.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," "one or more embodiments," "particular embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," "in particular embodiments," and similar language throughout this disclosure may, but do not necessarily, all refer to the same embodiment. The terms "embodiment" and "arrangement" are used interchangeably within this disclosure.

As defined herein, the term "processor" means at least one hardware circuit. The hardware circuit may be configured to carry out instructions contained in program code. The hardware circuit may be an integrated circuit. Examples of a processor include, but are not limited to, a central processing unit (CPU), an array processor, a vector processor, a digital signal processor (DSP), an FPGA, a programmable logic array (PLA), an ASIC, programmable logic circuitry, and a controller.

As defined herein, the term "output" (excluding specific references to the "output" argument described herein) means storing in physical memory, e.g., devices, writing to display or other peripheral output device, sending or transmitting to another system, exporting, or the like.

As defined herein, the term "real time" means a level of processing responsiveness that a user or system senses as sufficiently immediate for a particular process or determination to be made, or that enables the processor to keep up with some external process.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, state-setting data, or either source code or object code written in any combination of one or more programming languages, including an object-oriented programming language and/or procedural programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

In one or more embodiments, a method can include emulating, using a processor, a kernel designated for hardware acceleration by executing a device program binary that implements a register transfer level simulator for the kernel.

The device program binary may be executed in coordination with a host binary and a static circuitry binary. The method can include, during the emulating, detecting, using diagnostic program code of the static circuitry binary, an error condition caused by the device program binary and relating to a memory access violation or a kernel deadlock. A notification of the error condition may be output.

In an aspect, detecting the error condition can include, in response to a host instruction from executing the host binary to create a buffer, creating a buffer region having a buffer with a first buffer pad immediately above the buffer and a second buffer pad immediately below the buffer. The method can include determining that a memory operation accesses an address within the first buffer pad or the second buffer pad.

In another aspect, where the error condition is the memory access violation, detecting the error condition can include determining which of a plurality of variables specified as arguments for the device program binary is a subject of the kernel access memory violation. The determined variable is output as part of the notification.

In another aspect, where the error condition is the memory access violation, detecting the error condition can include tracking writes by the host binary and the device program binary to a memory specified by the static circuitry binary. The method can include determining that the device program binary has read an address in the memory that has not been written by either the host binary or the static circuitry binary.

In another aspect, where the error condition is the memory access violation, detecting the error condition can include tracking memory operations by the device program binary to a memory specified by the static circuitry binary. The method can include determining that at least one of the memory operations specifies an address that does not exist within the memory.

In another aspect, where the error condition is the kernel deadlock condition, detecting the error condition can include determining that a memory operation initiated by the device program binary on a memory specified in the static circuitry binary does not complete within a predetermined amount of time.

In another aspect, where the error condition is the memory access violation, detecting the error condition can include determining that a memory operation initiated by the device program binary to a memory specified in the static circuitry binary is for an amount of data less than a supported amount of data by an interface to the memory.

In another aspect, the method can include, during the emulating, determining that the device program binary read an address of a memory specified in the static circuitry binary at least two consecutive times.

In another aspect, where the kernel includes a compiler directive indicating independence of iterations of a loop contained within the kernel, the method can include detecting a dependency between consecutive ones of the iterations of the loop during the emulation.

In another aspect, where the error condition is the memory access violation, detecting the error condition can include determining that the device program binary initiated a read operation to a write-only buffer implemented within a memory specified in the static circuitry binary. The method can include determining that the device program binary initiated a write operation to a read-only buffer implemented within the memory specified in the static circuitry binary.

In one or more embodiments, a system includes a memory configured to store program code and a processor coupled to the memory. The processor, in response to executing the program code, is configured to initiate operations including emulating a kernel designated for hardware acceleration by executing a device program binary that implements a register transfer level simulator for the kernel. The device program binary is executed in coordination with a host binary and a static circuitry binary. The operations include, during the emulating, detecting, using diagnostic program code of the static circuitry binary, an error condition caused by the device program binary relating to a memory access violation or a kernel deadlock. The operations include outputting a notification of the error condition.

In an aspect, detecting the error condition can include, in response to a host instruction from executing the host binary to create a buffer, creating a buffer region having a buffer with a first buffer pad immediately above the buffer and a second buffer pad immediately below the buffer. The operations can include determining that a memory operation accesses an address within the first buffer pad or the second buffer pad.

In another aspect, the processor is configured to initiate operations including, during the emulating, determining that the device program binary read an address of a memory specified in the static circuitry binary at least two consecutive times.

In another aspect, where the error condition is the memory access violation, detecting the error condition can include determining which of a plurality of variables specified as arguments for the device program binary is a subject of the kernel access memory violation. The determined variable is output as part of the notification.

In another aspect, where the error condition is the memory access violation, detecting the error condition can include tracking writes by the host binary and the device program binary to a memory specified by the static circuitry binary. The operations can include determining that the device program binary has read an address in the memory that has not been written by either the host binary or the static circuitry binary.

In another aspect, where the error condition is the memory access violation, detecting the error condition can include tracking memory operations by the device program binary to a memory specified by the static circuitry binary. The operations can include determining that at least one of the memory operations specifies an address that does not exist within the memory.

In another aspect, where the error condition is the kernel deadlock condition, detecting the error condition can include determining that a memory operation initiated by the device program binary on a memory specified in the static circuitry binary does not complete within a predetermined amount of time.

In another aspect, where the error condition is the memory access violation, detecting the error condition can include determining that a memory operation initiated by the device program binary to a memory specified in the static circuitry binary is for an amount of data less than a supported amount of data by an interface to the memory.

In another aspect, where the error condition is the memory access violation, detecting the error condition can include determining that the device program binary initiated a read operation to a write-only buffer implemented within a memory specified in the static circuitry binary. The operations can include determining that the device program binary initiated a write operation to a read-only buffer implemented within the memory specified in the static circuitry binary.

In one or more embodiments, a method includes compiling, using a processor, host program code of a heterogeneous application into a host binary and generating, using the processor, a device program binary for a kernel of the heterogeneous application designated for hardware acceleration. The device program binary implements a register transfer level simulator using the kernel. The method can include compiling, using the processor, a high-level programming language model of static circuitry of a programmable integrated circuit into a static circuitry binary. The static circuitry of the programmable integrated circuit is configured to couple to a circuit implementation of the kernel. The compiling of the high-level programming language model of the static circuitry includes including, within the static circuitry binary, diagnostic program code configured to detect error conditions caused by the device program binary and relating to a memory access violation or a kernel deadlock. The static circuitry binary is used by the register transfer level simulator during emulation to detect the error conditions.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the embodiments disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method, comprising:
    emulating, using a processor, a kernel designated for hardware acceleration by executing a device program binary that, when executed, implements a register transfer level simulator for a register transfer level file specifying the kernel for implementation in a dynamically reconfigurable region of programmable circuitry of a device;
    wherein the device program binary is executed in coordination with a host binary that, when executed, emulates a host, and a static circuitry binary implemented as object code;
    wherein the static circuitry binary is compiled from high-level language models of static circuitry implemented in a static region of the programmable circuitry of the device, wherein the high-level language models of the static circuitry include a device memory model for a memory, an interface model for an interface to the host, and one or more interconnect models;
    wherein the static circuitry binary, when executed, emulates operation of the static circuitry coupled to the kernel and the memory and wherein the one or more interconnect models are configured to translate between high level language transactions used by the device memory model and the interface model and register transfer level signals used by the register transfer level simulator;
    during the emulating, the register transfer level simulator calling one or more functions of the static circuitry binary and detecting, using diagnostic program code of the static circuitry binary, an error condition caused by the device program binary and relating to a memory access violation or a kernel deadlock; and
    outputting a notification of the error condition.

2. The method of claim 1, wherein the detecting the error condition comprises:
    in response to a host instruction from executing the host binary to create a buffer within the memory, creating a buffer region in the static circuitry binary comprising a buffer with a first buffer pad immediately above the buffer and a second buffer pad immediately below the buffer; and
    determining that a memory operation initiated by the register transfer level simulator accesses an address within the first buffer pad or the second buffer pad.

3. The method of claim 1, wherein the error condition is the memory access violation, wherein the detecting the error condition comprises:
    determining which of a plurality of variables specified as arguments for the device program binary is a subject of the memory access violation; and
    wherein the determined variable is output as part of the notification.

4. The method of claim 1, wherein the error condition is the memory access violation, wherein the detecting the error condition comprises:
    tracking writes by the host binary and the device program binary to the memory; and
    determining that the device program binary has read an address in the memory that has not been written by either the host binary or the static circuitry binary.

5. The method of claim 1, wherein the error condition is the memory access violation, wherein the detecting the error condition comprises:
    tracking memory operations by the device program binary to the memory; and
    determining that at least one of the memory operations specifies an address that does not exist within the memory.

6. The method of claim 1, wherein the error condition is the kernel deadlock condition, wherein the detecting the error condition comprises:
    determining that a memory operation initiated by the device program binary on the memory does not complete within a predetermined amount of time.

7. The method of claim 1, wherein the error condition is the memory access violation, wherein the detecting the error condition comprises:
    determining that a memory operation initiated by the device program binary to the memory is for an amount of data less than a supported amount of data by a memory controller of the static circuitry that couples to the memory.

8. The method of claim 1, further comprising:
    during the emulating, determining that the device program binary read an address of the memory at least two consecutive times.

9. The method of claim 1, wherein the kernel includes a compiler directive indicating independence of iterations of a loop contained within the kernel, the method further comprising:
    detecting a dependency between consecutive ones of the iterations of the loop during the emulation.

10. The method of claim 1, wherein the error condition is the memory access violation, wherein the detecting the error condition comprises:

determining that the device program binary initiated a read operation to a write-only buffer implemented within the memory; or determining that the device program binary initiated a write operation to a read-only buffer implemented within the memory.

11. A system, comprising:

a processor configured to initiate operations including:

emulating a kernel designated for hardware acceleration by executing a device program binary that, when executed, implements a register transfer level simulator for a register transfer level file specifying the kernel for implementation in a dynamically reconfigurable region of programmable circuitry of a device;

wherein the device program binary is executed in coordination with a host binary that, when executed, emulates a host, and a static circuitry binary implemented as object code;

wherein the static circuitry binary is compiled from high-level language models of static circuitry implemented in a static region of the programmable circuitry of the device, wherein the high-level language models of the static circuitry include a device memory model for a memory, an interface model for an interface to the host, and one or more interconnect models;

wherein the static circuitry binary, when executed, emulates operation of the static circuitry coupled to the kernel and the memory and wherein the one or more interconnect models are configured to translate between high level language transactions used by the device memory model and the interface model and register transfer level signals used by the register transfer level simulator;

during the emulating, the register transfer level simulator calling one or more functions of the static circuitry binary and detecting, using diagnostic program code of the static circuitry binary, an error condition caused by the device program binary and relating to a memory access violation or a kernel deadlock; and outputting a notification of the error condition.

12. The system of claim 11, wherein the detecting the error condition comprises:

in response to a host instruction from executing the host binary to create a buffer within the memory, creating a buffer region in the static circuitry binary comprising a buffer with a first buffer pad immediately above the buffer and a second buffer pad immediately below the buffer; and determining that a memory operation initiated by the register transfer level simulator accesses an address within the first buffer pad or the second buffer pad.

13. The system of claim 11, wherein the error condition is the memory access violation, wherein the detecting the error condition comprises:

determining which of a plurality of variables specified as arguments for the device program binary is a subject of the memory access violation; and wherein the determined variable is output as part of the notification.

14. The system of claim 11, wherein the error condition is the memory access violation, wherein the detecting the error condition comprises:

tracking writes by the host binary and the device program binary to the memory; and determining that the device program binary has read an address in the memory that has not been written by either the host binary or the static circuitry binary.

15. The system of claim 11, wherein the error condition is the memory access violation, wherein the detecting the error condition comprises:

tracking memory operations by the device program binary to the memory; and determining that at least one of the memory operations specifies an address that does not exist within the memory.

16. The system of claim 11, wherein the error condition is the kernel deadlock condition, wherein the detecting the error condition comprises:

determining that a memory operation initiated by the device program binary on the memory does not complete within a predetermined amount of time.

17. The system of claim 11, wherein the error condition is the memory access violation, wherein the detecting the error condition comprises:

determining that a memory operation initiated by the device program binary to the memory is for an amount of data less than a supported amount of data by a memory controller of the static circuitry that couples to the memory.

18. The system of claim 12, wherein the processor is configured to initiate operations further comprising:

during the emulating, determining that the device program binary read an address of the memory at least two consecutive times.

19. The system of claim 11, wherein the error condition is the memory access violation, wherein the detecting the error condition comprises:

determining that the device program binary initiated a read operation to a write-only buffer implemented within the memory; or determining that the device program binary initiated a write operation to a read-only buffer implemented within the memory.

20. A method, comprising:

compiling, using a processor, host program code of a heterogeneous application into a host binary that, when executed, emulates a host;

generating, using the processor, a device program binary for a kernel of the heterogeneous application designated for hardware acceleration, wherein the device program binary, when executed, implements a register transfer level simulator for a register transfer level file specifying the kernel;

compiling, using the processor, a plurality of high-level programming language models corresponding to static circuitry of a programmable integrated circuit into a static circuitry binary, wherein the static circuitry of the programmable integrated circuit is configured to couple to a circuit implementation of the kernel within a dynamically reconfigurable region of programmable circuitry of the programmable integrated circuit; and during the compiling of the high-level programming language model of the static circuitry, including, within the static circuitry binary, diagnostic program code configured to detect error conditions caused by the device program binary and relating to a memory access violation or a kernel deadlock;

wherein one or more functions of the static circuitry binary are called by the register transfer level simulator during emulation to detect the error conditions;

wherein the plurality of high-level language models include a device memory model for a memory, an interface model for an interface to the host, and one or more interconnect models; and wherein the one or more interconnect models are configured to translate between high level language transactions used by the device memory model and the interface model and register transfer level signals used by the register transfer level simulator.

* * * * *